(12) United States Patent
Kitahara et al.

(10) Patent No.: US 6,253,775 B1
(45) Date of Patent: Jul. 3, 2001

(54) CLEANING APPARATUS

(75) Inventors: Shigenori Kitahara, Chikugo; Keiji Taguchi, Kurume; Hiroko Tsuboi, Tosu, all of (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/323,968

(22) Filed: Jun. 2, 1999

(30) Foreign Application Priority Data

| Jun. 4, 1998 | (JP) | 10-155770 |
| Jun. 12, 1998 | (JP) | 10-181584 |
| Jul. 17, 1998 | (JP) | 10-219705 |

(51) Int. Cl.[7] ................................................. B08B 3/10
(52) U.S. Cl. .......................... 134/108; 134/105; 134/111; 134/902
(58) Field of Search .................................. 134/111, 108, 134/188, 103.2, 105, 198, 902

(56) References Cited

U.S. PATENT DOCUMENTS

| 4,349,434 | * | 9/1982 | Jaworski . |
| 4,811,035 | * | 3/1989 | Huliba et al. . |
| 4,859,345 | * | 8/1989 | Inagaki . |
| 5,245,714 | * | 9/1993 | Haraga et al. . |
| 5,505,924 | * | 4/1996 | Johnson . |
| 5,651,893 | * | 7/1997 | Kenley et al. . |
| 6,179,577 | * | 1/2001 | Meyer . |

* cited by examiner

Primary Examiner—Frankie L. Stinson
(74) Attorney, Agent, or Firm—Smith, Gambrell & Russell

(57) ABSTRACT

A cleaning apparatus has a processing tank (21) for containing a processing liquid in which semiconductor wafers (W) are immersed, and a tubular vessel(22a) having a processing chamber (23) containing the processing tank (21). A side wall (26) of the vessel (22a), and a first partition wall (28) having an upright wall (27) standing on a bottom plate (23a) defining the bottom of the processing chamber (23) form a side ventilating duct (24). The bottom wall (30) of the vessel (22a), and a second partition wall (29) substantially horizontally extending from the lower end of the first partition wall (28) form a bottom ventilating duct (25). The side ventilating duct (24) and the bottom ventilating duct (25) can compactly arrange devices and pipes for supplying and discharging the cleaning liquid for cleaning semiconductor wafers (W), easily maintain the devices and pipes, easily arrange a ventilating system to the cleaning apparatus, and improve ventilation efficiency.

12 Claims, 18 Drawing Sheets

CLEANING APPARATUS

FIELD OF THE INVENTION

The present invention relates to a cleaning apparatus. More specifically, the present invention relates to a cleaning apparatus for cleaning workpieces, such as semiconductor wafers or LCD substrates.

DESCRIPTION OF THE RELATED ART

Generally, a cleaning apparatus is used widely in semiconductor device fabricating processes for cleaning workpieces, such as semiconductor wafers (hereinafter referred to simply as "wafers"). The cleaning apparatus transfers wafers sequentially to processing tanks respectively containing chemical liquids and rinsing liquids, and a drying unit to remove particles, organic metal contaminants or oxide films from the wafers, and to dry the wafers.

A cleaning apparatus of this kind comprises processing tanks respectively containing chemical liquids, such as $HF+H_2O$ (hydrogen fluoride solution), $NH_4OH+H_2O_2+H_2O$ (ammonia hydrogen peroxide solution), $HCl+H_2O_2+H_2O$ (hydrochloric acid hydrogen peroxide solution) and rinsing solution, such as pure water, liquid supplying and discharging equipment for supplying chemical liquids and rinsing liquids into and discharging the same from those processing tanks, including pipes, chemical liquid tanks, pumps, flow stabilizing devices, filters and such, and a ventilation system for ventilating the processing tanks to discharge atmospheres containing the chemical liquids during a cleaning process. Generally, the liquid supplying and discharging equipment is disposed behind a container containing the processing tanks.

The conventional cleaning apparatus of this kind needs many pieces of piping equipment including supply pipes and discharge pipes. These pieces of piping equipment need troublesome work for installation and difficult work for maintenance. Since discharge pipes and such are arranged in a complicated arrangement of the piping equipment, troublesome work is necessary for installing pipes to construct the ventilation system, and the ventilating performance of the ventilation system is unsatisfactory. The cleaning apparatus uses cleaning liquids, such as chemical liquids. It is desired to facilitate the maintenance of filters for filtering those cleaning liquids.

SUMMARY OF THE INVENTION

The present invention has been made in view of the foregoing circumstances and it is therefore an object of the present invention to provide a cleaning apparatus facilitating the maintenance of its components including filters, and having a ventilation system capable of easily installed and of functioning at an improved ventilation efficiency, and a method of ventilating the cleaning apparatus.

According to the present invention, a cleaning apparatus comprises: a tubular vessel defining a bottomed processing chamber, provided with a bottom plate and having a bottom wall and side walls; a processing tank placed in the processing chamber to contain a processing liquid for processing workpieces; a side ventilating duct formed by the side wall of the vessel, and a first partition wall including an upright wall standing from the bottom plate and a wall formed by extending the upright wall downward; and a bottom ventilating duct formed of the bottom wall of the vessel, and a second partition wall substantially horizontally extending from the lower end of the first partition wall, and connected to the side ventilating duct.

According to the present invention, the side ventilating duct is formed along the side wall of the tubular vessel defining the processing chamber for containing processing tanks, and the bottom ventilating duct is formed along the bottom wall of the vessel so as to be connected to the side ventilating duct. Therefore, a ventilation system can be separated from devices and pipes for supplying and discharging processing liquids. Consequently, the devices and the pipes for supplying and discharging the processing liquids can easily be arranged, and maintenance work for the maintenance of the devices and pipes is facilitate.

According to the present invention, the cleaning apparatus is characterized by a discharge opening to be connected to a discharge pipe, formed in the bottom ventilating duct.

The cleaning system according to the present invention is characterized in that at least either the side ventilating duct or the bottom ventilating duct communicates with the processing chamber by means of a connecting opening, and discharge opening to be connected to a discharge pipe is formed in the bottom wall of the vessel.

According to the present invention, the discharge opening to be connected to discharge pipe, formed in the bottom wall of the vessel facilitates the connection of the pipe of a ventilation system to the bottom ventilating duct and improves ventilation efficiency.

The cleaning apparatus according to the present invention is characterized by an airflow adjusting means disposed above an opening of the side ventilating duct formed in the vessel so as to cover a space around the opening of the side ventilating duct and the upper end of the upright wall to adjust the gap between the airflow adjusting means and the upright wall.

According to the present invention, air can be discharged outside at an optional discharge rate by adjusting the gap between the airflow adjusting means and the upright wall by the airflow adjusting means disposed above the opening of the side ventilating duct so as to cover the space around the opening of the side ventilating duct and the upper end of the upright wall.

According to the present invention the cleaning apparatus is characterized by a discharge pressure measuring means disposed between the upright wall and the airflow adjusting means.

According to the present invention, the airflow adjusting means is disposed above the opening of the side ventilating duct formed in the vessel so as to cover the space around the opening of the side ventilating duct and the upper end of the upright wall to adjust the gap between the airflow adjusting means and the upright wall, and the discharge pressure measuring means is disposed between the upright wall and the airflow adjusting means. Therefore, discharge pressure in a cleaning unit can easily be measured and the condition of a cleaning process can be monitored.

According to the present invention, the airflow adjusting means comprises a horizontal piece for covering the opening of the side ventilating duct, and a vertical piece extending downward from an end of the horizontal piece on the side of the processing tank to a position below the upper end of the upright wall, the horizontal piece is adjustably supported by a support member projecting inward from the side wall of the vessel.

The cleaning apparatus according to the present invention, is characterized by a gas-liquid separating wall uprightly provided on the bottom wall of the vessel around the discharge opening. The cleaning apparatus according to the present invention, is characterized by a draining opening formed in the bottom wall of the vessel.

According to the present invention, the gas-liquid separating wall is set in an upright position on the bottom wall of the vessel near the discharge opening so as to surround the discharge opening. Therefore, a liquid containing the chemical liquid can be separated from air to be discharged and can be collected on the bottom wall of the vessel. The liquid collected on the bottom wall can be drained outside through the draining opening formed in the bottom wall of the vessel.

The cleaning apparatus according to the present invention is characterized by a lower chamber formed below the processing tank placed in the processing chamber and having a volume greater than that of the processing liquid contained in the processing tank.

The cleaning apparatus according to the present invention is characterized in that the bottom plate is inclined and a draining opening is formed in a lower end part of the inclined bottom plate.

According to the present invention, the volume of the lower chamber defined by the bottom plate and a side wall of the vessel defining the processing chamber, and the upright wall is greater than at least the volume of the processing liquid contained in the processing tank. The processing liquid can be collected in the lower chamber even if the processing tank break by any chance and the processing liquid leaks out. Since the bottom plate of the vessel is inclined and the draining opening is formed in the lower end part of the bottom plate, the processing liquid collected in the lower chamber can be drained.

The cleaning apparatus according to the present invention is characterized in that a laterally opened housing space is defined by the bottom plate of the vessel, the first partition wall and the second partition wall, and devices for supplying the processing liquid are installed in the housing space for effective space utilization and to form the cleaning apparatus in a compact construction.

The cleaning apparatus according to the present invention is characterized by a filter unit disposed above the processing chamber defined by the vessel to clean air to be supplied into the processing chamber. Thus, clean air can be supplied into the processing chamber.

According to the present invention, a ventilation method of ventilating a cleaning apparatus comprising a tubular vessel defining a bottomed processing chamber, and a processing tank disposed in the processing chamber and containing a processing liquid in which workpieces are immersed comprises letting air contained in the processing chamber flow through a side ventilating duct formed of a side wall of the vessel and a first partition wall extended along the side wall, and a bottom ventilating duct connected to the side ventilating duct and formed of a second partition wall substantially horizontally extending from the lower end of the first partition wall and a bottom wall included in the vessel to a discharge opening, and discharging the air outside through a discharge pipe connected to the discharge opening.

According to the present invention, a ventilation method of ventilating a cleaning apparatus comprising a plurality of tubular vessels each defining a bottomed processing chamber, and processing tanks disposed in the processing chambers to contain processing liquids in which workpieces are immersed, respectively, comprises letting air contained in each processing chamber flow through a side ventilating duct formed of a side wall of the vessel and a first partition wall extended along the side wall, and a bottom ventilating duct connected to the side ventilating duct and formed of a second partition wall substantially horizontally extending from a lower end of the first partition wall and a bottom wall included in the vessel to a discharge opening, and discharging the air outside through a discharge pipe connected to the discharge opening.

According to the present invention, atmospheres in the processing chambers can efficiently be discharged outside without being affected by devices and pipes for supplying and discharging processing liquids. -The ventilation method according to the present invention is characterized by optionally adjusting the flow rate of air in the side ventilating duct by an airflow adjusting means.

The ventilation method according to the present invention is characterized in that at lest one of the processing tanks disposed in the plurality of vessels contains a chemical liquid, and the flow rate of air flowing through the side ventilating duct for each vessel is adjusted so that a discharge pressure in the processing chamber containing the processing tank containing the chemical liquid is not higher than those in the processing chambers containing the processing tanks containing liquids other than chemical liquids.

According to the present invention, atmospheres in the processing chambers can be made to flow through the side ventilating ducts and the bottom ventilating ducts toward the discharge opening and can be discharged outside through the discharge pipe, and the rate of discharge of air can optionally be regulated.

The ventilation method according to the present invention is characterized in that the flow rate of air flowing through the side ventilating duct is regulated optionally to make the flow rate of air supplied through a filter unit disposed above the processing chamber of the vessel into the processing chamber is equal to the flow rate of air flowing through the side ventilating duct.

The ventilation method according to the present invention is characterized in that the flow rates of air flowing through the side ventilating ducts for the vessels are adjusted optionally so that the flow rate of air supplied through a filter unit disposed above the processing chambers of the vessels is equal to the sum of the flow rates of air flowing through the side ventilating ducts for the plurality of vessels.

According to the present invention, the flow rate of air discharged outside from the cleaning apparatus is equal to that of clean air supplied through the filter unit into the processing chambers. Therefore, air can be discharged only through the ventilation system for safer ventilation.

The cleaning apparatus ventilating method according to the present invention is characterized in separating liquids contained in air to be discharged outside through the discharge opening from the air when the air flows through the discharge opening to discharge only air not containing the liquids.

According to the present invention, the liquid containing the chemical liquid is separated from air before discharging the air to prevent discharging the chemical liquid together with the air when discharging the air outside the cleaning apparatus.

According to the present invention, a cleaning apparatus comprises: a cleaning tank; and a cleaning liquid supply circuit for supplying a cleaning liquid, including a pump for pumping a cleaning liquid, a flow stabilizing device for stabilizing the flow of the cleaning liquid, a temperature regulator for regulating the temperature of the cleaning liquid and a filter for filtering the cleaning liquid; wherein the pump is provided with an inlet port and an outlet port formed on one side surface thereof, the flow stabilizing device has an inlet port and an outlet port formed in one side surface thereof, the temperature regulator has an inlet port and an outlet port formed in one side surface thereof, the filter has an inlet port and an outlet port formed in one surface thereof, and the pump, the flow stabilizing device, the temperature regulator and the filter are disposed with the inlet and the outlet port of the pump, the inlet and the outlet port of the flow stabilizing device, the inlet and the outlet port of the temperature regulator, and the inlet and the outlet port of the filter facing substantially one plane.

According to the present invention, the components, i.e., the pump, the flow stabilizing device, the temperature regulator and the filter, are disposed with the respective inlet and the outlet ports thereof facing substantially one plane. Therefore, an operator is able to carry out all the work for connecting pipes to the components, changing the pipes, inspecting and repairing the components on one side of the components from the side of the plane. Thus, work for the manufacture and maintenance of the cleaning apparatus is facilitated. The expression, "facing substantially one plane" signifies not only a condition where the respective inlet and outlet ports of the components face one plane uniformly but also a condition where the inlet and the outlet ports of some or all the components face the one plane obliquely in directions in a range of directions which facilitate work for the manufacture and maintenance of the cleaning apparatus.

Preferably, the respective inlet and outlet ports of the pump, the flow stabilizing device, the temperature regulator and the filter face a side surface of the cleaning apparatus. When the inlet and the outlet ports face the side surface, an operator facing the side surface is able to work with ease. A satisfactory working environment can be secured for the operator.

It is desirable to place the pump, the flow stabilizing device, the temperature regulator and the filter on a rack. The components can properly be arranged on the rack.

It is desirable to dispose the pump, the flow stabilizing device, the temperature regulator and the filter adjacently to reduce space necessary for installing all the components.

According to the present invention, a cleaning apparatus comprises: a cleaning tank; and a cleaning liquid supply circuit for supplying a cleaning liquid to the cleaning tank, including a pump for pumping the cleaning liquid, a temperature regulator for regulating the temperature of the cleaning liquid and a filter for filtering the cleaning liquid; wherein the pump is provided with an inlet port and an outlet port formed on one side surface hereof, the temperature regulator has an inlet port and an outlet port formed in one side surface thereof, the filter has an inlet port and an outlet port formed in one surface thereof, and the pump, the temperature regulator and the filter are disposed with the inlet and the outlet port of the pump, the inlet and the outlet port of the temperature regulator, and the inlet and the outlet port of the filter facing substantially one plane.

In the cleaning apparatus, the components, i.e., the pump, the temperature regulator and the filter, are disposed with the respective inlet and the outlet ports thereof facing substantially one plane. Thus, work for the manufacture and maintenance of the cleaning apparatus is facilitated.

Preferably, the respective inlet and outlet ports of the pump, the temperature regulator and the filter face a side surface of the cleaning apparatus. When the inlet and the outlet ports face the side surface, a satisfactory working environment can be secured for the operator and the operator is able to carry out work with ease from outside the cleaning apparatus. It is desirable to place the pump, the temperature regulator and the filter on a rack. It is desirable to dispose the pump, the temperature regulator and the filter adjacently. This construction enables the components to be arranged properly. Since there are only the three components, space necessary for installing all the components can be reduced.

Preferably, the pump has a function to stabilize the flow of the cleaning liquid. When the pump has a function to stabilize the flow of the cleaning liquid, space necessary for installing the components can further reduced and the flow of the cleaning liquid can be stabilized.

According to the present invention, a cleaning apparatus comprises: a cleaning tank; and a cleaning liquid supply circuit for supplying a cleaning liquid to the cleaning tank, including a pump for pumping the cleaning liquid, a flow stabilizing device for stabilizing the flow of the cleaning liquid, and a filter for filtering the cleaning liquid; wherein the pump is provided with an inlet port and an outlet port formed on one side surface thereof, the flow stabilizing device has an inlet port and an outlet port formed in one side surface thereof, the filter has an inlet port and an outlet port formed in one surface thereof, and the pump, the flow stabilizing device and the filter are disposed with the inlet and the outlet port of the pump, the inlet and the outlet port of the flow stabilizing device, and the inlet and the outlet port of the filter facing substantially one plane.

In the cleaning apparatus, the components, i.e., the pump, the flow stabilizing device and the filter, are disposed with the respective inlet and the outlet ports thereof facing substantially one plane. Thus, work for the manufacture and maintenance of the cleaning apparatus is facilitated. Preferably, the respective inlet and outlet ports of the pump, the flow stabilizing device and the filter face a side surface of the cleaning apparatus. When the inlet and the outlet ports face the side surface, a satisfactory working environment can be secured for the operator and the operator is able to carry out work with ease from outside the cleaning apparatus. It is desirable to place the pump, the flow stabilizing device and the filter on a rack. It is desirable to dispose the pump, the flow stabilizing device and the filter adjacently. This construction enables the components to be arranged properly. Since there are only the three components, space necessary for installing all the components can be reduced.

According to the present invention, a cleaning apparatus comprises: a cleaning tank; and a cleaning liquid supply circuit for supplying a cleaning liquid to the cleaning tank, including a pump for pumping the cleaning liquid and a filter for filtering the cleaning liquid; wherein the pump is provided with an inlet port and an outlet port formed on one side surface thereof, the filter has an inlet port and an outlet port formed in one surface thereof, and the pump and the filter are disposed with the inlet and the outlet port of the pump, and the inlet and the outlet port of the filter facing substantially one plane. In the cleaning apparatus, the components, i.e., the pump and the filter, are disposed with the respective inlet and the outlet ports thereof facing substantially one plane. Thus, work for the manufacture and maintenance of the cleaning apparatus is facilitated.

Preferably, the respective inlet and outlet ports of the pump and the filter face a side surface of the cleaning apparatus. When the inlet and the outlet ports face the side surface, a satisfactory working environment can be secured for the operator and the operator is able to carry out work with ease from outside the cleaning apparatus. It is desirable to place the pump and the filter on a rack. It is desirable to dispose the pump and the filter adjacently. This construction enables the components to be arranged properly. Since there are only the two components, space necessary for installing all the components can be reduced. Preferably, the pump has a function to stabilize the flow of the cleaning liquid. When the pump has such a function, space necessary for installing the components can be reduced and the flow of the cleaning liquid can be stabilized.

Preferably, the filter is disposed with its length extended horizontally. This disposition of the filter enables the filter to be installed in a space having a low height. It is desirable that the cleaning liquid supply circuit is a circulation circuit capable of returning the cleaning liquid discharged from the cleaning tank into the cleaning tank. Thus, the cleaning liquid can be used repeatedly and the consumption of the cleaning liquid can be reduced.

According to the present invention, a cleaning apparatus comprises: a cleaning tank capable of containing wafers; and a cleaning liquid supply circuit including a filter comprising a tubular case having an inlet port and an outlet port, and a filter element disposed in the tubular case to filter a cleaning liquid by letting the cleaning liquid flow from a primary side toward a secondary side of the filter element; wherein the tubular case of the filter is disposed with its center axis extended laterally, and the tubular case is provided with a vent hole for discharging gases outside from the tubular case.

Since the tubular case of the filter is disposed with its center axis extended laterally in this cleaning apparatus, the filter can be installed in a space having a low height as compared with that of a space necessary for installing a filter included in a conventional cleaning apparatus. Since gases can be discharged through the vent hole, gases will not be accumulated in the filter.

Preferably, the primary and the secondary side of the filter element are the side of the outer circumference of the filter element and the side of the inner circumference of the filter element, respectively, and the cleaning liquid is filtered from the outer circumference toward the inner circumference.

It is desirable that the tubular case of the filter is disposed with its center axis extended substantially horizontally. When the tubular case is thus disposed, a space necessary for installing the filter has a low height and gases will not be accumulated in the filter.

Preferably, the tubular case of the filter is provided with a first vent hole through which gases accumulated in a space defined by the outer circumference of the filter element and the inner circumference of the tubular case are discharged outside, and a second vent hole through which gases accumulated in the inside of the filter element are discharged outside. When the filter is thus formed, gases accumulated in the space defined by the outer circumference of the filter element and the inner circumference of the tubular case, and in the filter element can be discharged outside through the first and the second vent hole.

It is desirable to form the first vent hole on a level above that of the inlet through which the cleaning liquid flows into the filter. When the first vent hole is formed on such a level, it is possible to prevent the discharge of the cleaning liquid supplied into the space between the outer circumference of the filter element and the inner circumference of the tubular case and not yet filtered outside through the first vent hole, and to remove effectively gases accumulated in the same space from the filter. Since gas bubbles contained in a liquid are forced upward by buoyancy, the gases can effectively be removed from the space when the first vent hole is formed at or near a position corresponding to the highest part of the space.

The gases discharged through the first vent hole may be discharged into the cleaning tank through a first discharge circuit. When the gases can be discharged into the cleaning tank, the cleaning liquid discharged together with the gases through the first vent hole can be returned into the cleaning tank to prevent the effluence of the cleaning liquid from the cleaning apparatus.

It is desirable to form the second vent hole on a level higher than that of the outlet port of the filter through which the cleaning liquid is delivered. When the second vent hole is formed on such a level, it is possible to prevent the discharge of the filtered cleaning liquid flowing through the inside of the filter outside through the second vent hole, and to remove effectively gases accumulated in the inside of the filter element. Since gas bubbles contained in a liquid are forced upward by buoyancy, the gases accumulated in the inside of the filter element can effectively be removed when the second vent hole is formed at or near a position corresponding to the highest part of the filter element.

It is desirable to discharge the gases discharged through the second vent hole into the cleaning tank through a second discharge circuit. When the gases can be discharged into the cleaning tank, the cleaning liquid discharged together with the gases from the filter can be returned into the cleaning tank to prevent the effluence of the cleaning liquid from the cleaning apparatus. It is desirable to form the first venthole, the second vent hole, the inlet port and the outlet port in one side surface of the filter. This construction reduces a space for containing the filter element, and facilitates work for connecting circuits to the filter, work for changing parts and work for the maintenance of the filter.

DESCRIPTION OF THE PREFERRED EMBODIMENTS

First Embodiment

A cleaning apparatus in a first embodiment according to the present invention will be described hereinafter as applied to a semiconductor wafer processing system.

Figure 1:
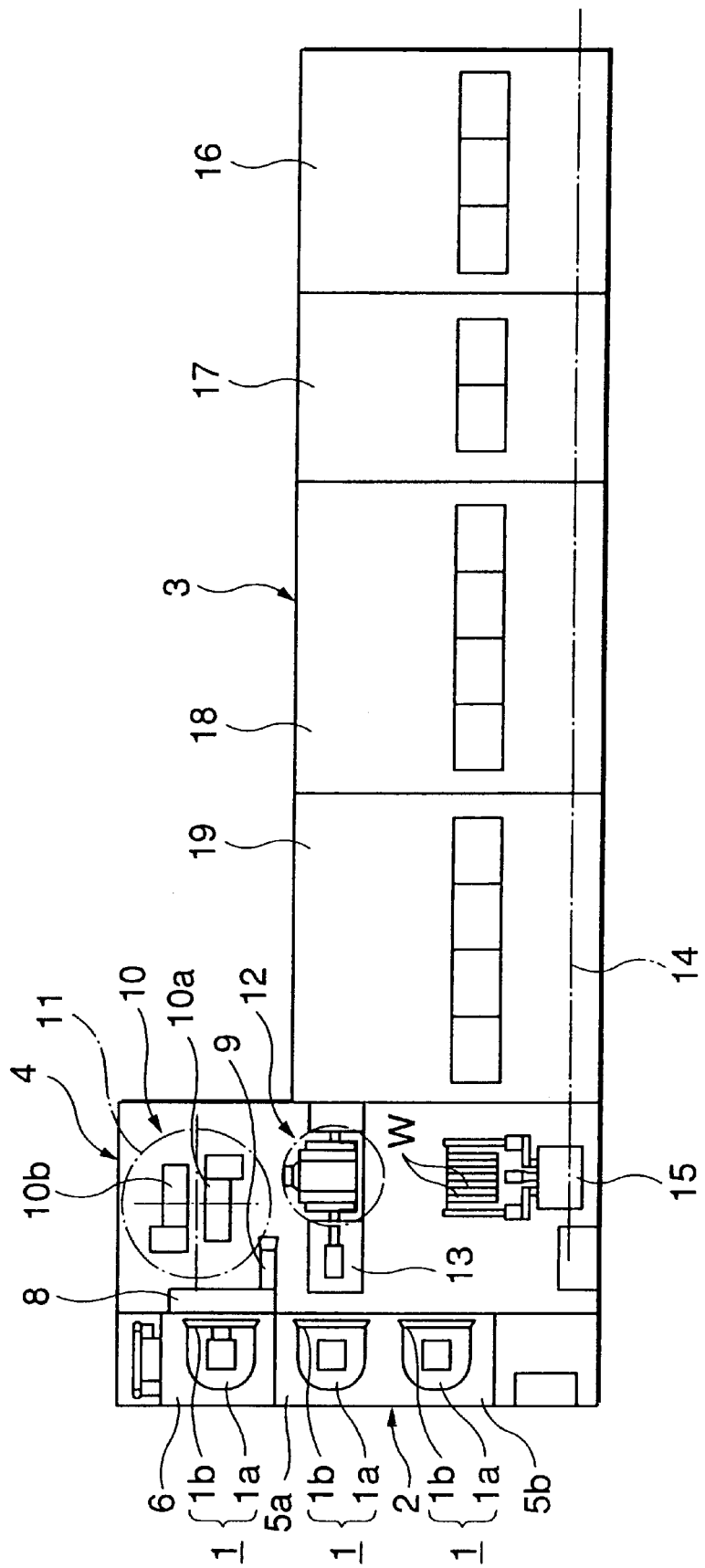
FIG. 1 is a schematic plan view of a processing system employing cleaning apparatuses according to the present invention.

FIG. 1 is a schematic plan view of a processing system employing the cleaning apparatus of the present invention. The processing system comprises, as principal components, a wafer carrier handling unit 2 for receiving and delivering a wafer carrier 1 containing semiconductor wafers W (hereinafter referred to simply as "wafers W"), a processing unit 3 for processing wafers W with chemical liquids, cleaning liquids and the like and drying wafers W, and a transfer unit 4 interposed between the wafer handling unit 2 and the processing unit 3 to transfer wafers W from the wafer handling unit 2 to the processing unit 3, to return the wafers W from the processing unit 3 to the wafer handling unit 2, to position wafers W, to change the position wafers W and to adjust intervals between wafers W.

The wafer handling unit 2 has a carrier receiving unit 5a, a carrier delivering unit 5b and a wafer receiving/delivering unit 6. The carrier receiving unit 5a, the carrier delivering unit 5b and the wafer receiving/delivering unit 6 are disposed at one end of the processing system. A carrying mechanism, not shown, is interposed between the carrier receiving unit 5a and the wafer receiving/delivering unit 6 to carry a carrier 1 from the carrier receiving unit 5a to the wafer receiving/delivering unit 6.

Carrier lifters, not shown, are placed in the carrier delivering unit 5b and the wafer receiving/delivering unit 6, respectively, to deliver an empty wafer carrier 1 to a wafer carrier reserving unit, not shown, and to receive an empty wafer carrier 1 from the wafer carrier reserving unit. A wafer carrier carrying robot, not shown, capable of moving in horizontal directions along the X- and the Y-axis and in vertical directions along the Z-axis is installed in the wafer carrier reserving unit. The wafer carrier carrying robot arranges properly empty wafer carriers 1 carried by the wafer receiving/delivering unit 6 to the wafer carrier reserving unit, and carries a wafer carrier 1 to the wafer carrier delivering unit 5b. Wafer carries 1 containing wafers W, as well as empty carriers 1, can be stored in the wafer carrier reserving unit.

A wafer carrier 1 comprises a container 1a having one open end having walls provided in their inner surfaces with grooves, not shown, to hold therein a plurality of wafers W, for example, twenty-five wafers W at proper intervals in a horizontal position, and a lid 1b for covering the open end of the container 1a. A locking mechanism, not shown, incorporated into the lid 1b is operated by a lid operating device 8 to take the lid 1b off and put the same on the container 1a.

The wafer receiving/delivering unit 6 has an opening opening into the transfer unit 4, and the lid operating device 8 is placed in the opening of the wafer receiving/delivering unit 6. The lid operating device 8 takes the lid 1b off and puts the same on the container 1a of the wafer carrier 1. The wafer carrier 1 containing unprocessed wafers W is received by the wafer receiving/delivering unit 6, the lid operating device 8 takes off the lid 1b of the wafer carrier 1, all the unprocessed wafers W are taken out of the wafer carrier 1, and then the lid operating device 8 puts the lid 1b on the container 1a. When the empty wafer carrier 1 is carried from the wafer carrier reserving unit to the wafer receiving/delivering unit 6, the lid operating device 8 takes the lid 1b, wafers W are put into the wafer carrier 1, and the lid operating device 8 puts the lid 1b on the container 1a. A mapping sensor 9 is disposed near the opening of the wafer receiving/delivering unit 6 to count the number of wafers W contained in the wafer carrier 1.

The transfer unit 4 comprises a wafer carrying arm 10 capable of holding a plurality of wafers W, for example, twenty-five wafers W, and of receiving wafers W arranged in a horizontal position from the wafer receiving/delivering unit 6, and of transferring wafers W arranged in a horizontal position to the wafer receiving/delivering unit 6, an interval adjusting device, not shown, such as a pitch changer, for holding a plurality of wafers W, for example, fifty wafers W, at predetermined intervals in a vertical position, a position changing device 12 disposed between the wafer carrying arm 10 and the pitch changer capable of simultaneously setting a plurality of wafers, for example, twenty-five wafers W, in a horizontal position or a vertical position, and a notch aligner 13 capable of detecting notches formed in the wafers W set in a vertical position and of aligning the wafers W. The transfer unit 4 is connected to the processing unit 3 by a carrying passage 14. A wafer carrying chuck 15, i.e., a wafer carrying means, moves along the carrying passage 14.

The wafer carrying arm 10 is provided with two arm units, i.e., a first arm unit 10a and a second arm unit 10b. The arm units 10a and 10b take out a plurality of wafers W from and puts a plurality of wafers W into the wafer carrier 1 placed in the wafer receiving/delivering unit 6. The arm units 10a are mounted for individual operation to hold wafers W in a horizontal position on a table 11 capable of moving in horizontal directions along the X- and the Y-axis and in vertical directions along the Z-axis and of turning in a direction θ. The arm units 1a and 10b carries wafers W between the wafer carrier 1 placed in the wafer receiving/delivering unit 6 and the position changing unit 12. Unprocessed wafers W and processed wafers W can be held by the first arm unit 10a and the second arm unit lob, respectively.

The processing unit 3 has a plurality of processing sections 16 to 19 each employing the cleaning apparatus of the present invention to remove particles and organic substances adhering to wafers W and to remove a metal film or an oxide film formed on wafers W. The processing sections 16 to 19 are arranged in a row. The wafer carrying chuck 15, i.e., a wafer carrying means, moves along the carrying passage 14 disposed opposite to the processing sections 16 to 19. The wafer carrying chuck 15 is capable of moving in horizontal directions along the X- and the Y-axis and in vertical directions along the Z-axis and of turning in a direction θ. A chuck cleaning apparatus 16a is disposed in the first processing section 16. The chuck cleaning apparatus 16a need not necessarily be disposed in the first processing section 16 and may be disposed outside the processing units 16, 17, 18 and 19 or may be interposed between the processing unit 3 and the transfer unit 4.

Figure 2:
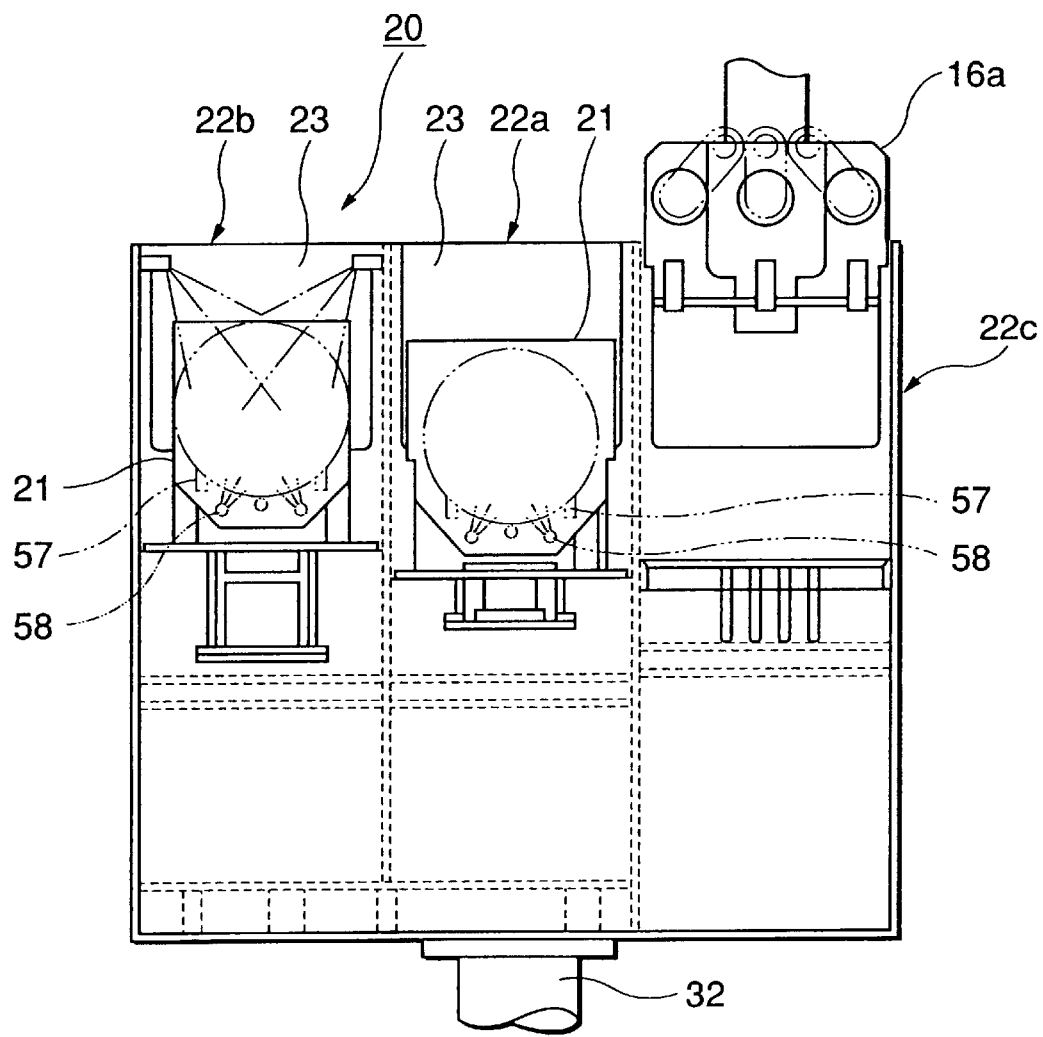
FIG. 2 is a schematic side elevation of a cleaning apparatus in a first embodiment according to the present invention.
Figure 3:
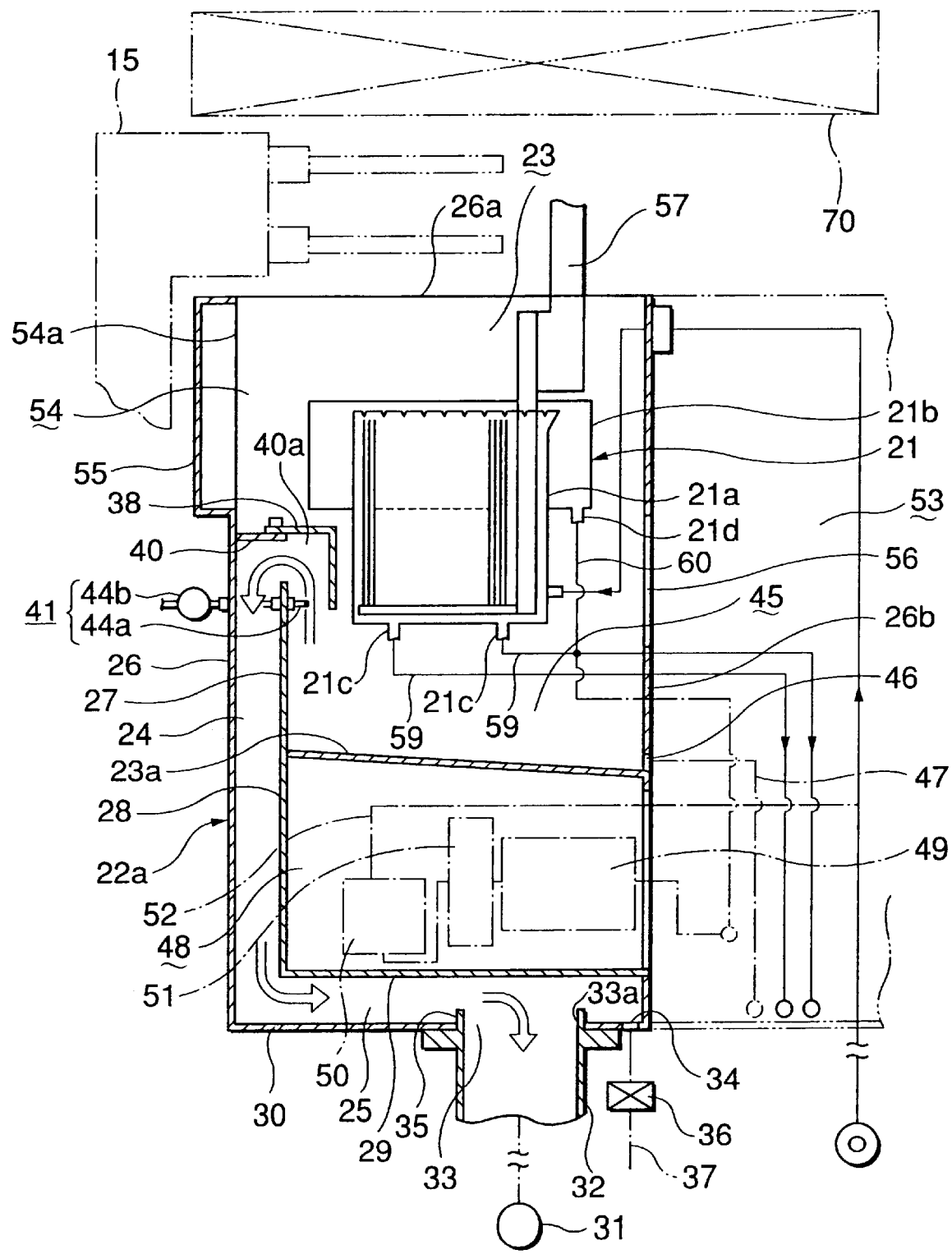
FIG. 3 is a sectional view of an essential part of the cleaning apparatus of FIG. 2.

A cleaning apparatus 20 in a first embodiment according to the present invention will be described with reference to FIGS. 2 to 6. FIG. 2 is a schematic side elevation of the cleaning apparatus 20 installed in the first processing section 16, and FIG. 3 is a sectional view of an essential part of the cleaning apparatus 20 of FIG. 2.

Figure 5:
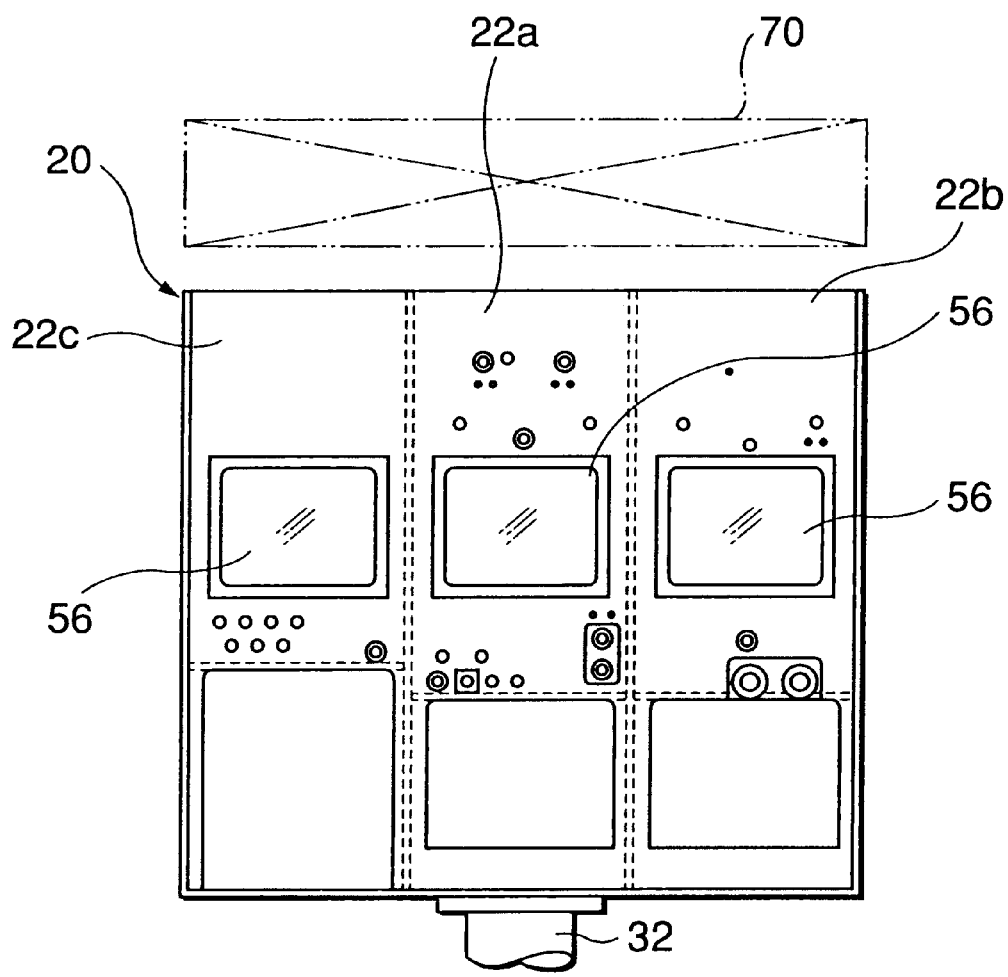
FIG. 5 is a rear view of the cleaning apparatus of FIG. 2.

Referring to FIG. 2, the cleaning apparatus 20 comprises a first vessel 22a having the shape of, for example, a rectangular tube, a processing tank (cleaning tank) 21 placed in the first vessel 22a and containing a processing liquid (cleaning liquid), such as an HF solution (chemical liquid), a second vessel 22b having the shape of, for example, a rectangular tube, and a processing tank 21 placed in the second vessel 22b and containing a processing liquid other than a chemical liquid, such as a rinsing liquid (pure water). A third vessel 22c having the shape of, for example, a rectangular tube and containing the chuck cleaning unit 16a is disposed contiguously with the first vessel 22a as best shown in FIG. 5. A space between the vessels 22a, 22b and 22c, and a filter unit 70, which will be described later, is covered by walls to isolate the space from air around the processing apparatus 20.

Since the first vessel 22a and the second vessel 22b are substantially the same in construction, only the first vessel 22a and the associated parts will be described. The first vessel 22a includs a processing chamber (cleaning chamber) 23 provided with a bottom plate 23a, and a processing tank 21 is disposed in the processing chamber 23. The vessel 22a has a side ventilating duct 24 and a bottom ventilating duct 25 connected to the side ventilating duct 24. The filter unit 70 for cleaning air when air is supplied into the processing chambe 23, is disposed above the processing chamber 23, of the vessel 22a (FIG. 3).

The side ventilating duct 24 is formed of the front side wall 26 of the vessel 22a, and a first partition wall 28 having an upright wall 27 standing upright from the bottom plate 23a defining the processing chamber 23 and a vertical extending downward from the upright wall 27. An open end 40a of the side ventilating duct 24 opens into the processing chamber 23. The bottom ventilating duct 25 is formed of the bottom wall 30 of the vessel 22a, and a second partition wall 29 extending substantially horizontally from the lower end of the first partition wall 28.

A discharge opening 33 is formed in the bottom wall 30 of the first vessel 22a. The discharge opening 33 is connected, through a discharge pipe 32, to a vacuum pump 31, i.e., a discharging means. A drain opening 34 is formed in the bottom wall 30 of the first vessel 22a. A gas-liquid separating wall is formed around the discharge opening 33 so as to project upward from the bottom wall 30. The gas-liquid separating wall prevents a chemical liquid, such as an HF solution, contained in air flowing through the side ventilating duct 24 and the bottom ventilating duct 25 from flowing into the discharge pipe 32 together with the air. The discharge opening 33 may be formed in an optional part of the bottom wall 30. A drain pipe 37 provided with a drain valve 36 is connected to the drain opening 34 to drain a liquid collected on the bottom wall 30 of the vessel 22a.

An adjustable airflow adjusting plate 38 is held above the upper open end of the side ventilating duct 24 so as to cover a space around the open upper end of the side ventilating duct 24 and the upper end of the upright wall 27. A gap between the upright wall 27 and the airflow adjusting plate 38 is adjustable. As shown in FIG. 4, the airflow adjusting plate 38 has a horizontal part 38a covering the open upper opening of the side ventilating duct 24, and a vertical part 38b extending from the inner end of the horizontal part 38a to a position below the level of the upper end of the upright wall 27. A slot 38c is formed in the horizontal part 38a of the airflow adjusting plate 38. A bolt 39 is screwed through the slot 38c in a threaded hole formed in a bracket 40 projecting inward from the side wall 26 of the vessel 22a. The airflow adjusting plate 38 can be moved horizontally relative to the bracket 40 to adjust the size of the gap between the upright wall 27 and the vertical part 38b of the airflow adjusting plate 38.

Thus, the position of the horizontal part 38a of the airflow adjusting plate 38 relative to the bracket 40 can be adjusted to adjust the size of the gap between the upright wall 27 and the vertical part 38b of the airflow adjusting plate 38. Thus, the flow rate of air flowing through the side ventilating duct 24 can optionally be adjusted. The flow rate of air flowing through the side ventilating duct 24 can be adjusted so as to coincide with the flow rate of air filtered by the filter unit 70 and supplied into the processing camber 23. The sum of the flow rates of air flowing through the side ventilating ducts 24 of the vessels 22a, 22b and 22c can be adjusted so as to coincide with the sum of the flow rates of clean air supplied into the processing chambers 23 of the vessels 22a, 22b and 22c.

The spontaneous effluence of atmospheres in the processing chambers 23 through means other than the ventilating ducts 24, 25 can be prevented by making the flow rate of air discharged by ventilation from the processing apparatus 20 equal to the sum of the flow rates of clean air supplied into the processing chambers 23.

The pressure of air discharged from the processing chamber 23 including the processing tank 21 containing a chemical liquid, such as an HF solution, can be adjusted so as to be lower than those of air discharged from the processing chambers 23 containing the processing tanks 21 containing a liquid other than the chemical liquid to prevent the atmosphere containing the chemical liquid from flowing into the other vessels.

Figure 4A:
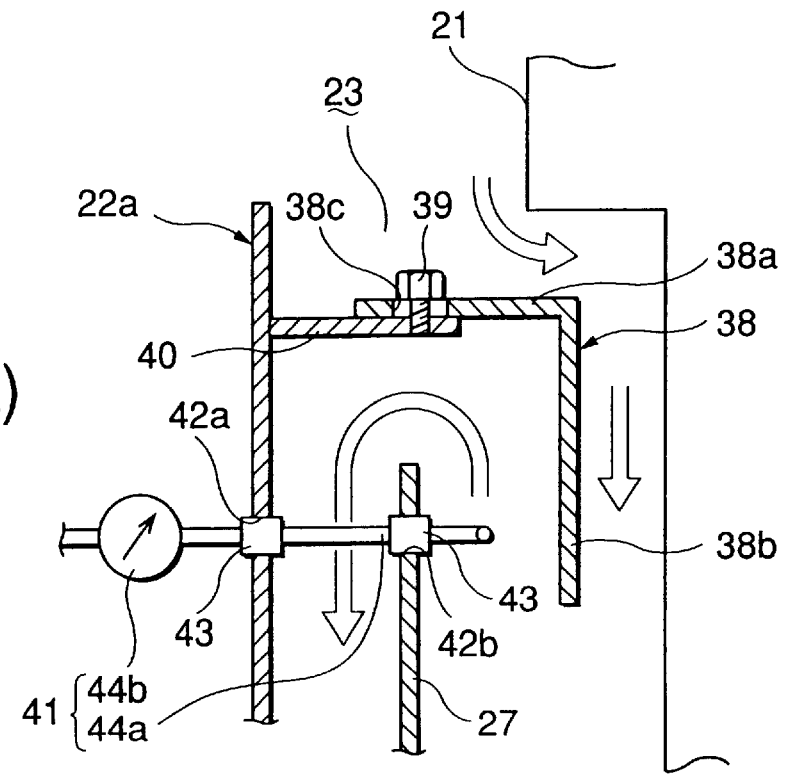
FIGS. 4(a) and 4(b) are schematic sectional views of an airflow adjusting plate and a discharge pressure measuring device in modifications, respectively.
Figure 4B:
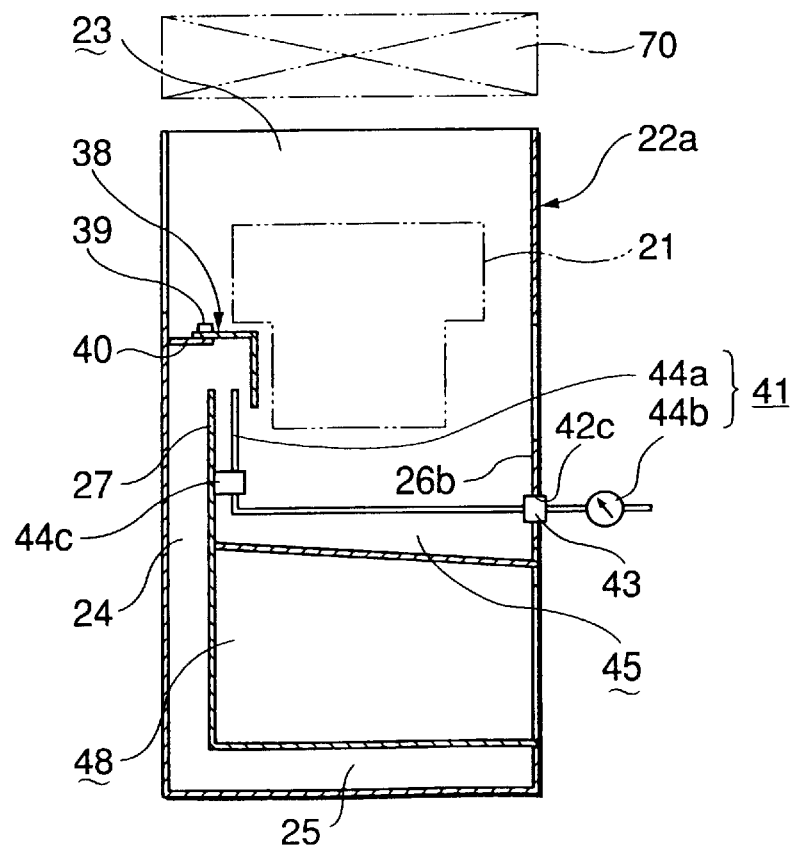

A discharge pressure measuring device 41 is disposed between the upright wall 27 and the airflow adjusting plate 38 to measure the pressure of air flowing through the side ventilating duct 24. As shown in FIG. 4(a), the discharge pressure measuring device 41 has a pipe 44a held by holders 43 hermetically fitted in holes 42a and 42b formed in the side wall 26 and the upright wall 27, respectively, so as to extend across the side ventilating duct 24 and to project into the gap between the upright wall 27 and the vertical part 38b of the airflow adjusting plate 38, and a pressure gage 44b connected to an outer end part of the pipe 44a projecting outside from the vessel 22a. In this processing apparatus 20, the pressure gage 44b of the discharge pressure measuring device 41 is attached to the front side wall of the vessel 22a. The pressure gage 44b may be attached to the back wall of the vessel 22a; that is, a substantially L-shaped pipe 44a may be held by a holding member 44c on the upright wall 27 and by a holding member 43 hermetically fitted in a hole 42c formed in the back wall 26b of the vessel 22a so that an inner end part extend vertically into the gap between the upright wall 27 and the vertical part 38b of the airflow adjusting plate 38 as shown in FIG. 4(b). And a pressure gage 44b may be connected to a back end part of the pipe 44a projecting outside from the back wall 26b.

A lower chamber 45 is defined in a lower section of the processing chamber 23 by the bottom plate 23a, the back wall 26b, side walls 26a extending between the side walls 26 and 26b, and the upright wall 27. The lower chamber 45 is formed in a volume greater than that of the processing liquid, such as an HF solution or pure water, contained in the processing tank 21 in order that all the processing liquid can be collected in the lower chamber 45 to secure safety even if the processing tank 21 should break by any chance and the processing liquid leaks out. The bottom plate 23a of the processing chamber 23 descends from the front side of the cleaning apparatus 20 toward the back side of the same. A drain opening 46 is formed in the back wall 26b near the lower end of the bottom plate 23a. A drain pipe 47 provided with a drain valve, not shown, is connected to the drain opening 46.

A housing space 48 having an open back end is defined by the bottom plate 23a of the processing chamber 23, the first partition wall 28 and the second partition wall 29. Pieces of processing liquid supplying and discharging equipment including a circulation pump 49, a flow stabilizing device 50, a heater 51 and pipes 52 connecting those devices are housed in the housing space 48. Therefore, only the supply and the discharge pipes 52 can be neatly and systematically arranged in a back space 53 on the back side of the cleaning apparatus 20, and space can effectively be utilized.

Instruments and operating devices, not shown, are arranged in a space 54 behind an upper part of the front side wall 26 of the vessel 22a. An open end 54a of the space 54 is covered with a detachable cover 55. An observation hole 56 is formed in the back wall 26b of the vessel 22a to enable the visual observation of the interior of the vessel 22a.

The processing tank 21 has an inner tank 21a for containing wafers W, and an outer tank 21b surrounding an open upper part of the inner tank 21a to contain the processing liquid overflowed the inner tank 21a. A vertically movable wafer boat 57 is disposed in the inner tank 21a. The wafer carrying chuck 15 transfers a plurality of wafers W, such as fifty wafers 2, to and receives the same from the wafer boat 57. Supply nozzles 58 are disposed in a lower part of the space in the inner tank 21a to supply the processing liquid into the inner tank 21a. Drain openings 21c are formed in the bottom wall of the inner tank 21a. Drain pipes 59 provided with drain valves, not shown, are connected to the drain openings 21c, respectively. A drain opening 21d is formed in the bottom wall of the outer tank 21b. A drain pipe 60 provided with a drain valve, not shown, is connected to the drain opening 21d and is connected through a selector valve, not shown, to the pipe 52 connected to one of the pieces of the processing liquid supplying and discharging equipment to use the processing liquid, such as an HF solution, overflowed the inner tank 21a again for cleaning wafers W by returning the processing liquid to the inner tank 21a.

Figure 6A:
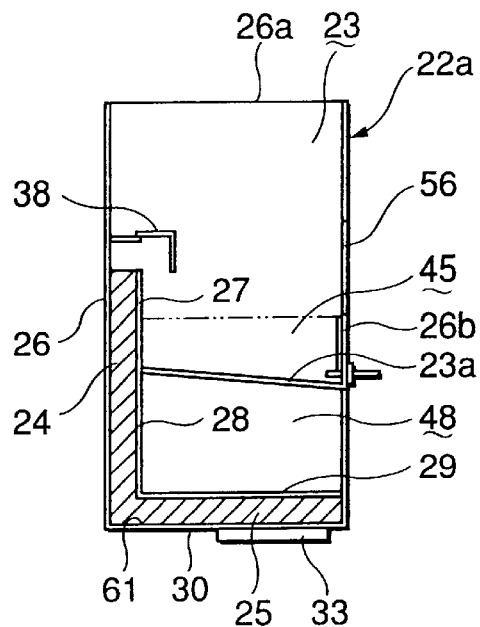
FIGS. 6(a), 6(b), 6(c) and 6(d) are schematic sectional views of different processing vessels.
Figure 6B:
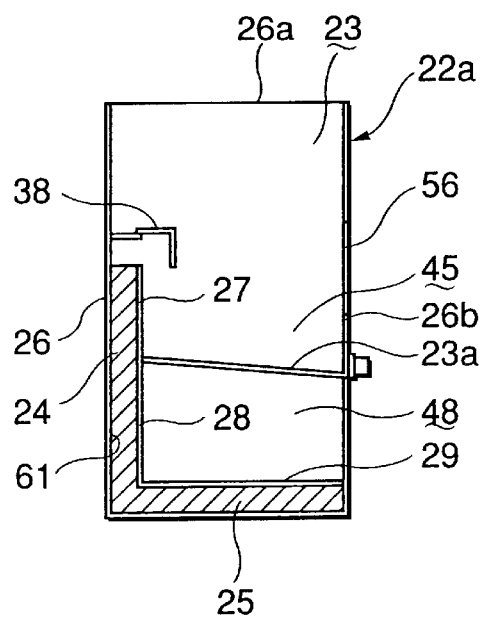
Figure 6C:
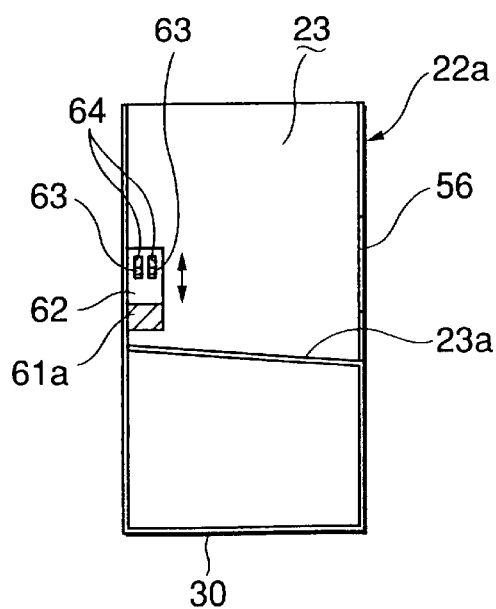
Figure 6D:
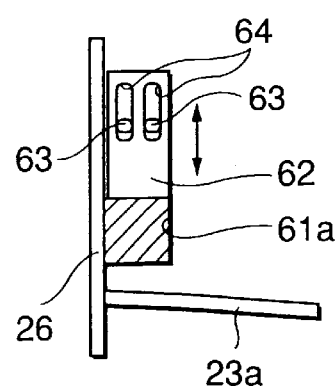

Although only the first vessel 22a has been described, the second vessel 22b is the same in construction as the first vessel 22a, except that the second vessel 22b has a bottom wall 30 not provided with any opening corresponding to the drain opening 34 and the discharge opening 33. The first vessel 22a and the second vessel 22b communicate with each other by means of a connecting opening 61 (FIGS. 6(a) and 6(b)) of a shape resembling the sectional shape of the side ventilating ducts 24 and the bottom ventilating ducts 25 of the vessels 22a and 22b. The connecting opening 61 need not necessarily correspond to both the side ventilating duct 24 and the bottom ventilating duct 25, but may correspond to only either the side ventilating duct 24 or the bottom ventilating duct 25. As shown in FIGS. 6(c) and 6(d), the first vessel 22a and the third vessel 22c communicates with each other through a connecting opening 61a formed in a partition wall between the first vessel 22a and the third vessel 22c at a position on a level slightly above that of the upper surfaces of the bottom plates 23a of the processing chambers 23 to prevent a cleaning liquid used for cleaning the wafer carrying chuck 15 in the third vessel 22c from accidentally flowing into the first vessel 22a. The size of the connecting hole 61a can be adjusted by means of a connecting opening adjusting plate 62. The connecting opening adjusting plate 62 is provided with guide slots 64, and guide pins 63 projecting from the partition wall are slidably inserted in the guide slots 64 to guide the connecting opening adjusting plate 62 for sliding movement (FIG. 6(d)).

The first vessel 22a, the second vessel 22b and the third vessel 22c are thus arranged, the first vessel 22a and the second vessel 22b communicate with each other by means of at least either the side ventilating ducts 24 or the bottom ventilating ducts 25, and the discharge opening 33 is formed in the bottom wall 30 of the first vessel 22a. Therefore, air flowing through the vessels 22a, 22b and 22c can be discharged outside through the discharge opening 33 formed in the first vessel 22a. The accuracy of a cleaning process for cleaning wafers W can be improved because a contaminated atmosphere produced by contaminating clean air supplied through the filter unit 70 to the processing units of the cleaning apparatus 20, i.e., the processing tanks 21 and the processing chambers 23, with the chemical liquid and pure water scattered outside the processing tanks 21 during the cleaning process can be discharged outside through the side ventilating ducts 24 and the bottom ventilating ducts 25.

Although the processing apparatus 20 in this embodiment has the plurality of vessels, i.e., the first vessel 22a, the second vessel 22b and the third vessel 22c, arranged in a unit. A processing apparatus in accordance with the present invention may be provided with a single vessel, two vessels, four vessels or more than four vessels. When a processing apparatus is provided with two vessels, four vessels or more than four vessels, at least either the side ventilating ducts or the bottom ventilating ducts of the adjacent vessels may be connected through connecting openings and a discharge opening may be formed in the bottom wall of at least one of the vessels.

Although the cleaning apparatus in this embodiment according to the present invention has been described as applied to a semiconductor wafer cleaning system, it goes without saying that the present invention is applicable to a cleaning apparatus for cleaning workpieces other than semiconductor wafers, such as LCD substrates.

The cleaning apparatus of the present invention thus constructed exercises the following effects.

(1) Since a side ventilating duct is formed along a side wall of a tubular vessel defining a processing chamber containing a processing tank, and a bottom ventilating duct is formed along the bottom wall of the vessel and is connected to the side ventilating duct, a ventilation system can be separated from processing liquid supplying and discharging equipment and pipes connected to the processing liquid supplying and discharging equipment. Consequently, the disposition of the processing liquid supplying and discharging equipment and the pipes connected to the same can be facilitated and work for the maintenance of the processing liquid supplying and discharging equipment and the pipes connected to the same is facilitated.

(2) Since the discharge opening connected to the discharge pipe is formed in the bottom ventilating duct, the pipe of the ventilation system can easily be connected to the bottom ventilating duct and ventilating efficiency can be improved.

(3) Since the adjustable airflow adjusting plate is held above the open upper end of the side ventilating duct so as to cover a space around the open upper end of the side ventilating duct 24 and the upper end of the upright wall to adjust the gap between the upright wall and the airflow adjusting plate, the flow rate of air discharged outside can optionally be adjusted.

(4) Since the adjustable airflow adjusting plate is held above the open upper end of the side ventilating duct so as to cover a space around the open upper end of the side ventilating duct and the upper end of the upright wall to adjust the gap between the upright wall and the airflow adjusting plate, and the discharge pressure measuring device is disposed between the upright wall and the airflow adjusting plate, the pressure in the cleaning unit can easily be measured and the condition of the cleaning process can be monitored.

(5) Since the gas-liquid separating wall is formed so as to surround the discharge opening and to project upward from the bottom wall of the vessel, the liquid contained in air to be discharged can be separated from the air before the air is discharged outside and the separated liquid can be collected on the bottom wall of the vessel. The liquid collected on the bottom wall can be drained through the drain opening formed in the bottom wall of the vessel.

(6) Since the lower chamber is formed in a volume greater than that of the processing liquid contained in the processing tank, all the processing liquid can be collected in the lower chamber even if the processing tank should break by any chance and the processing liquid leaks out. Since the bottom plate of the processing chamber is inclined and the drain opening is formed near the lower end of the bottom plate, the processing liquid collected in the lower chamber can be drained outside.

(7) Since the housing space having the open side end is defined by the bottom plate of the processing chamber, the first partition wall and the second partition wall to house the processing liquid supplying and discharging equipment therein, space can efficiently be utilized and the cleaning apparatus can be formed in a compact construction.

(8) The cleaning apparatus has, in addition to functions described in (1) to (7), a function to supply clean air into the processing chamber.

(9) The atmosphere in the processing chamber can efficiently be discharged outside the cleaning apparatus without being obstructed by the processing liquid supplying and discharging equipment and the associated pipes.

(10) The cleaning apparatus has, in addition to a function described in (9), a function to adjust the flow rate of air to be discharged outside optionally.

(11) Since the spontaneous effluence of atmospheres in the processing chambers 23 from the processing apparatus can be prevented by making the flow rate of air discharged by ventilation from the processing apparatus equal to the sum of the flow rates of clean air supplied into the processing chambers, the cleaning apparatus has, in addition to an effect described in (9) an effect to prevent the effluence of air through parts other than the ventilation system to ensure safer ventilation.

(12) Since the liquid containing the chemical liquid and contained in air to be discharge can be separated from the air, the cleaning apparatus has, in addition to effects described in (9) to (11), an effect to prevent the discharge of the chemical liquid and the like together with air.

Second Embodiment

Figure 7:
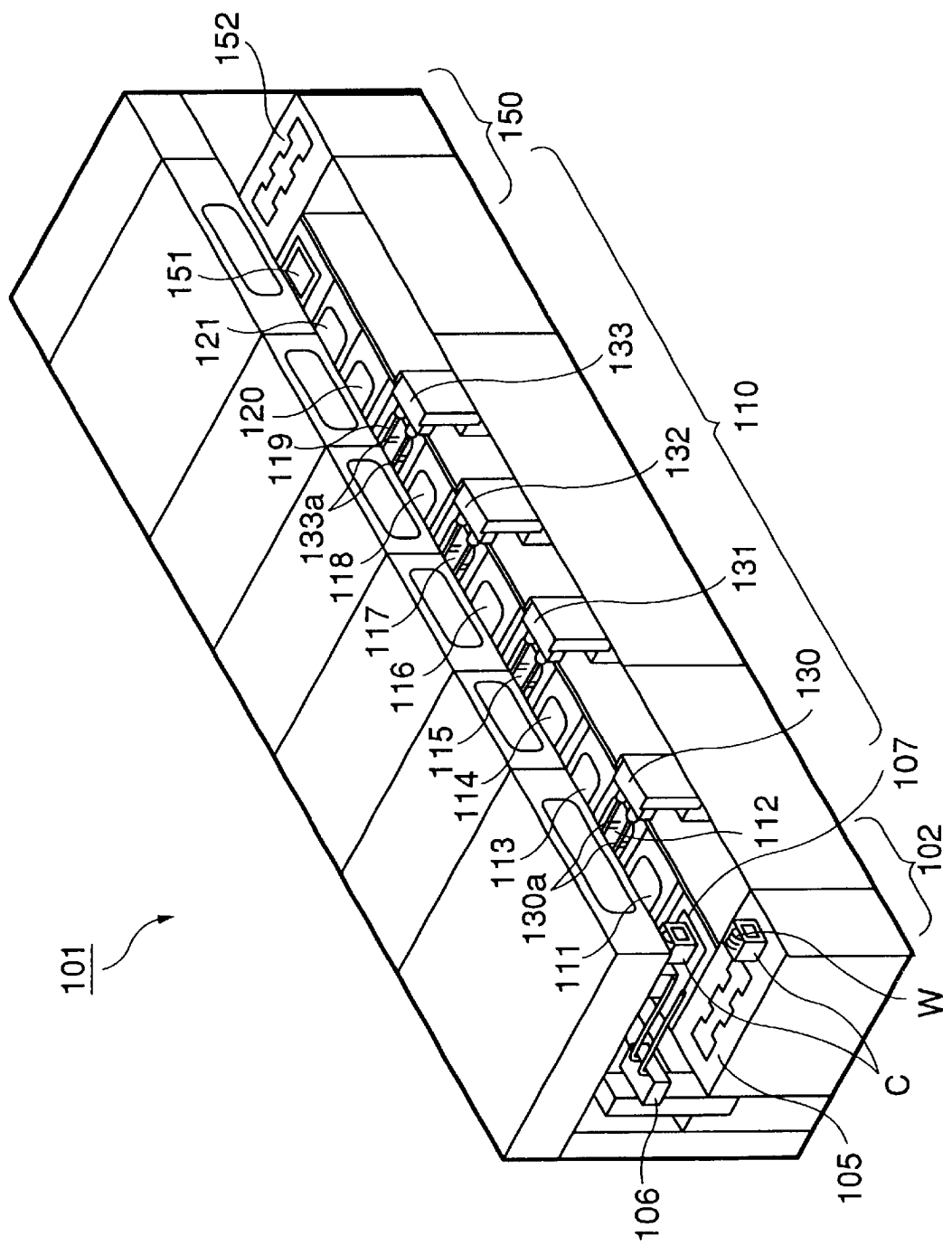
FIG. 7 is a perspective view of a processing system employing a cleaning apparatus in a second embodiment according to the present invention.

A cleaning apparatus in a second embodiment according to the present invention will be described hereinafter. A cleaning system employing cleaning apparatuses in accordance with the present invention carries out an integrated cleaning method including a carrier receiving process for receiving wafers contained in a wafer carrier in a lot, a wafer cleaning process, a wafer drying process and a wafer delivering process for delivering wafers contained in a wafer carrier. FIG. 7 is a perspective view of a cleaning system 101 provided with cleaning apparatuses 112 to 119 in accordance with the present invention.

The cleaning system 101 has a wafer receiving and handling unit 102 for receiving a wafer carrier C containing twenty-five uncleaned wafers W and sending the uncleaned wafers W to a cleaning unit. The wafer receiving and handling unit 102 carries two wafer carriers C received by a receiving unit 105 to a loader 107 in each carrying cycle by a carrying device 106. The loader 107 takes out wafers W from the wafer carriers C.

A cleaning and drying unit 110 for processing wafers W by a predetermined cleaning process comprises a wafer chuck cleaning and drying apparatus 111 for cleaning and drying a wafer chuck 130a included in a carrying device 130, which will be described later, and cleaning apparatuses 112 to 119 for cleaning wafers W with various kinds of cleaning liquids. The cleaning apparatuses 112, 114, 116 and 118 clean wafers W with cleaning liquids each containing a chemical agent as a principal component, and the cleaning apparatuses 113, 115, 117 and 119 rinse wafers W with pure water to carry out a general cleaning process comprising alternate operations for chemical cleaning and rinsing. The cleaning and drying unit 110 further comprises a wafer chuck cleaning and drying apparatus 120 for cleaning and drying a wafer chuck 133a included in a carrying device 133, which will be described later, and a drying apparatus 121 for processing wafers W for final drying with, for example, a vapor of isopropyl alcohol (IPA). Wafer carrying devices 130, 131, 132 and 133 are arranged sequentially in that order on the front side (on this side in FIG. 7) of the cleaning and drying unit 110.

Figure 8:
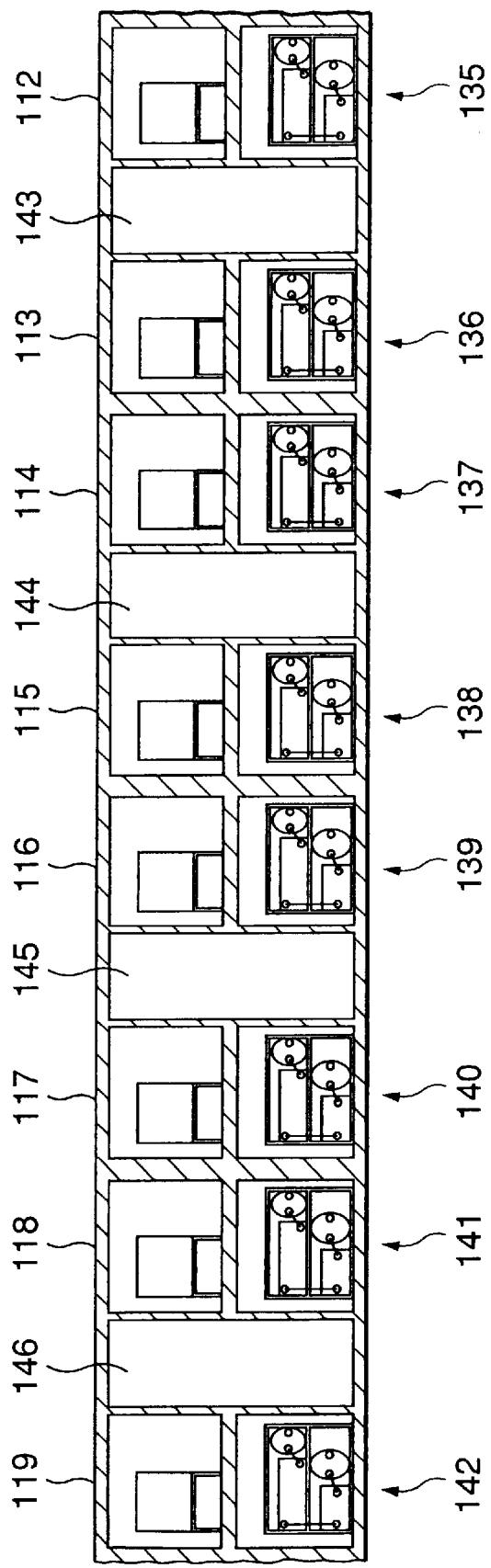
FIG. 8 is a rear sectional view of an essential part of the processing system.

FIG. 8 is a longitudinal sectional view of a back part of the cleaning apparatuses 112 to 119, i.e., a back part of the cleaning system 101. The cleaning apparatuses 112 to 119 are provided with liquid circulating systems 135, 136, 137, 138, 139, 140, 141 and 142, respectively, to circulate cleaning liquids for cleaning, respectively. Maintenance spaces 143, 144, 145 and 146 are formed between the respective liquid circulating systems 135 and 136 of the cleaning apparatuses 112 and 113, between the respective circulating systems 137 and 138 of the cleaning apparatuses 114 and 115, between the respective liquid circulating systems 139 and 140 of the cleaning apparatuses 116 and 117, and between the respective liquid circulating systems 141 and 142 of the cleaning apparatuses 118 and 119, respectively. The arrangement and combination of the cleaning apparatuses may optionally be determined taking into consideration the kinds of cleaning processes suitable for cleaning wafers W. For example, some of those cleaning apparatuses may be omitted or cleaning apparatuses using other kinds of chemical liquids for cleaning wafers W may be added to the foregoing cleaning system.

A loading and delivering unit 150 for loading twenty-five wafers W into a wafer carrier C and delivering the wafer carrier C carries a wafer carrier C loaded with wafers W to a delivery unit 152 by an unloader 151.

Figure 9:
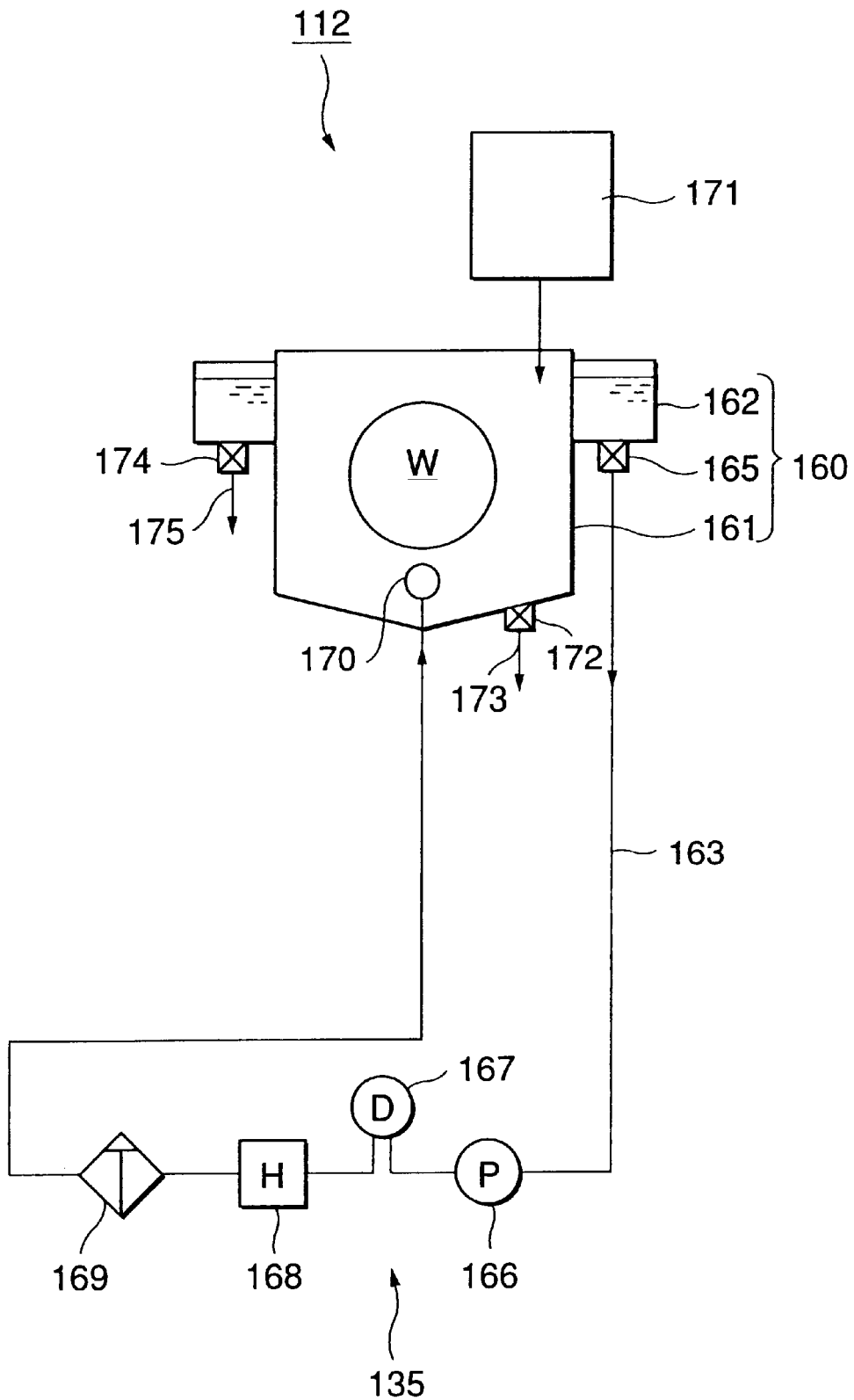
FIG. 9 is a circuit diagram of a liquid circulating system included in a cleaning apparatus in accordance with the present invention.

Since the cleaning apparatuses 112 to 119 are similar in construction, only the cleaning apparatus 112 will be described with reference to FIGS. 9 to 12 by way of example. Referring to FIG. 9 showing the liquid circulating system 135 of the cleaning apparatus 112 in a circuit diagram, a cleaning tank 160 included in the cleaning apparatus 112 has a box-shaped inner tank 161 of a size large enough to contain wafers W, and an outer tank 162. The outer tank 162 is formed so as to surround an open upper end part of the inner tank 161 to contain a cleaning liquid overflowed the inner tank 161.

A liquid circulating circuit 163 has one end connected to the inner tank 161 and the other end connected to the outer tank 162 to circulate the cleaning liquid during a cleaning process for cleaning wafers W. The inlet of the circulating circuit 163 is connected through a valve 165 to the bottom wall of the outer tank 162. A pump 166, a flow stabilizing device (damper) 167, a temperature regulator 168 and a filter 169 are arranged in this order in the circulating circuit 163. The outlet of the circulating circuit 163 is connected to nozzles 170. The valve 165 is opened to allow the cleaning liquid which has overflowed the inner tank 161 into the outer tank 162, to flow into the circulating circuit 163. The pump 166 of the circulating circuit 163 pumps the cleaning liquid to force the cleaning liquid to flow sequentially through the flow stabilizing device 167, the temperature regulator 168 and the filter 169. The cleaning liquid adjusted to a desired temperature by the temperature regulator 168 and filtered by the filter 169 is returned through the nozzles 170 into the inner tank 161. The cleaning apparatus 112 is provided with a cleaning liquid tank 171 storing the cleaning liquid to fill the inner tank 161 with the cleaning liquid at the beginning of the cleaning process and to replenish the inner tank 161 with the cleaning liquid when necessary.

A drain line 173 provided with a drain valve 172 is connected to the bottom wall of the inner tank 161 to drain the used cleaning liquid from the cleaning tank 160. A drain line 175 provided with a drain valve 174 is connected to the bottom wall of the outer tank 162.

Figure 10:
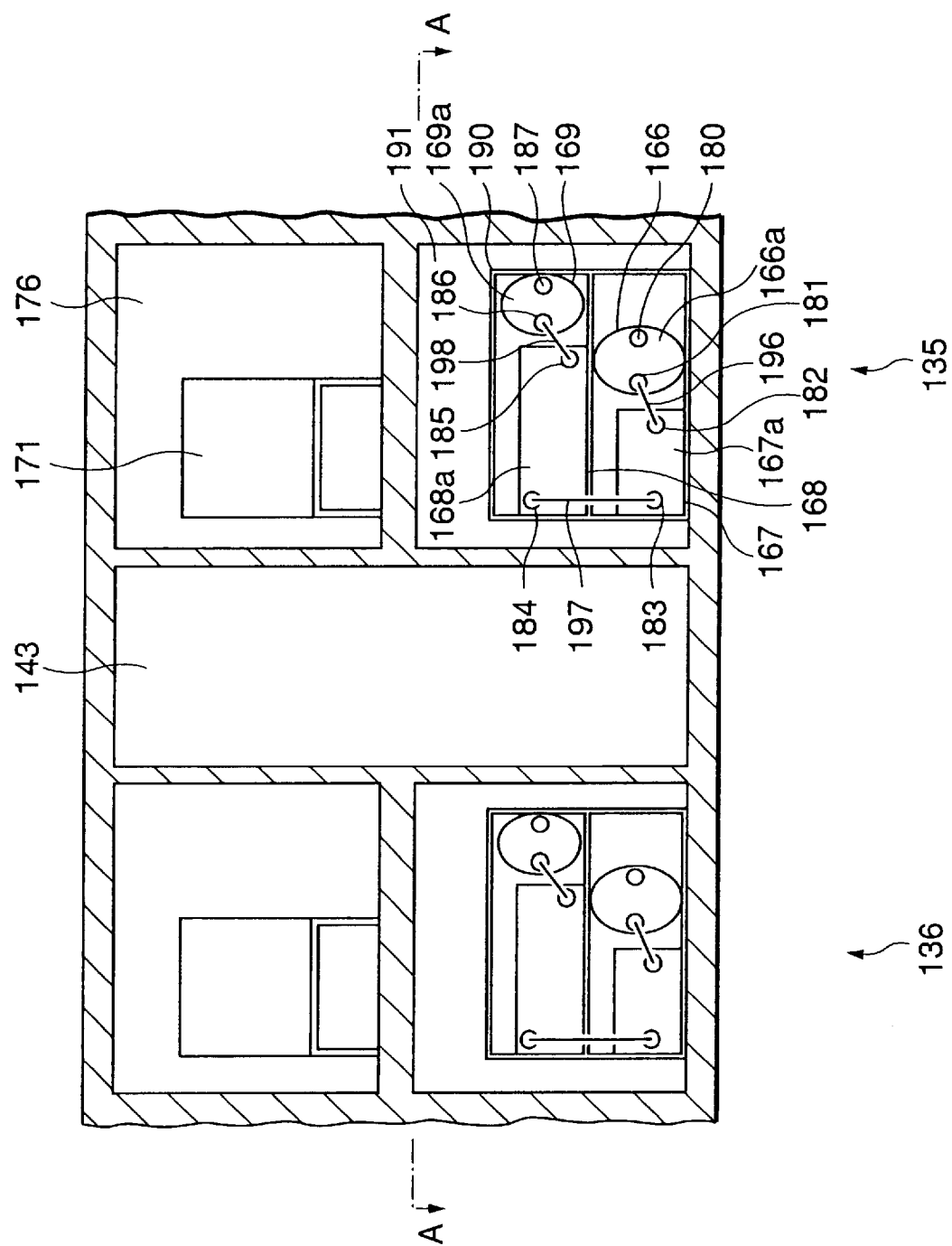
FIG. 10 is a rear sectional view of a cleaning apparatus.
Figure 11:
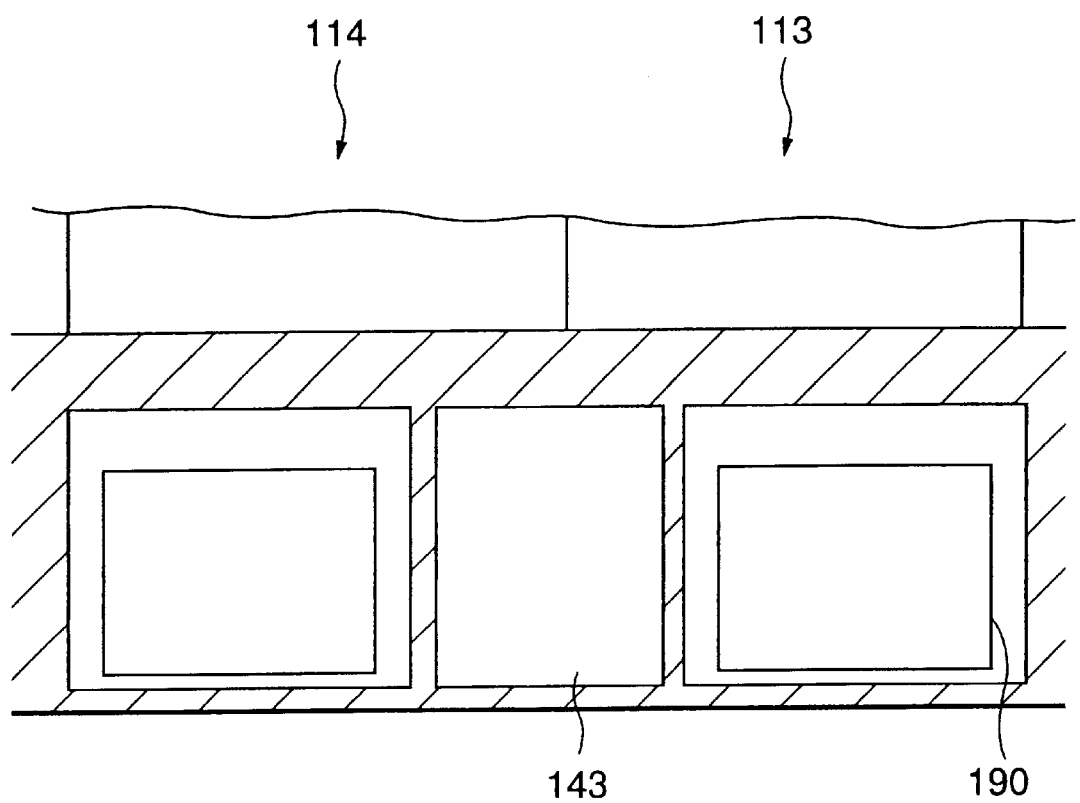
FIG. 11 is a sectional view taken on line A—A in FIG. 10.
Figure 12:
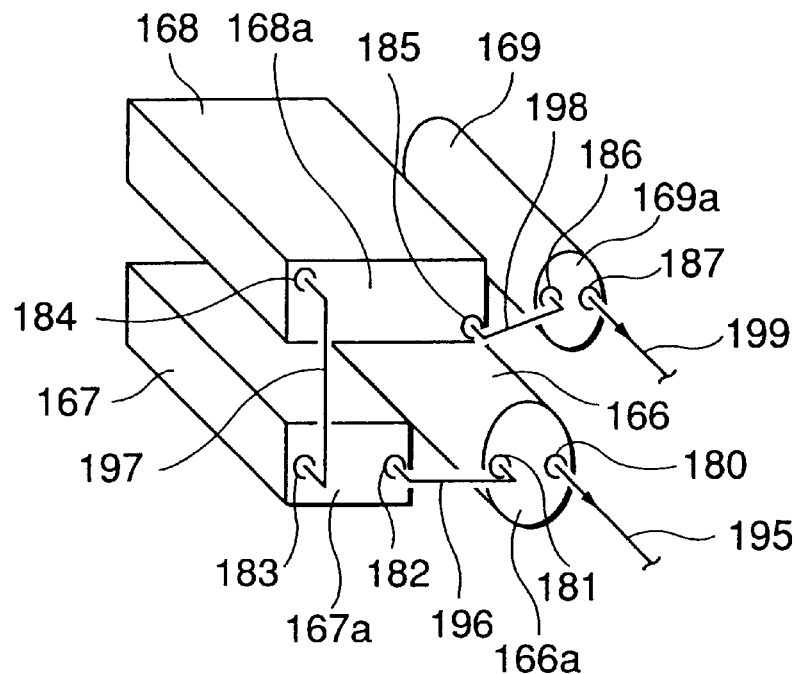
FIG. 12 is a diagrammatic perspective view of an arrangement of a pump, a temperature regulator, a flow stabilizing device and a filter.

The arrangement of the pump 166, the flow stabilizing device 167, the temperature regulator 168 and the filter 169 of the liquid circulating system 135 will be described more specifically. FIG. 10 is an enlarged longitudinal sectional view of back parts of the cleaning apparatuses 112 and 113 shown in FIG. 8, FIG. 11 is a sectional view taken on line A—A in FIG. 10, and FIG. 12 is a perspective view of the pump 166, the flow stabilizing device 167, the temperature regulator 168 and the filter 169. As shown in FIG. 10, the cleaning liquid tank 171 is disposed in a back part of an upper space 176.

Referring to FIGS. 9 and 12, the pump 166 has an inlet port 180 and an outlet port 181 in a side surface 166a, the flow stabilizing device has an inlet port 182 and an outlet port 183 in a side surface 167a, the temperature regulator 168 has an inlet port 184 and an outlet port 185 formed in a side surface 168a, and the filter 169 has an inlet port 186 and an outlet port 187 in a side surface 169a. The pump 166, the flow stabilizing device 167, the temperature regulator 168 and the filter 169 are placed on a rack 190 placed in back part of a lower space 191 of the cleaning apparatus 112 with the inlet ports 180, 182, 184 and 186, and the outlet ports 181, 183, 185 and 187 facing the back surface of the cleaning apparatus 112.

The pump 166 and the flow stabilizing device 167 are disposed adjacently on a lower shelf of the rack 190, and the temperature regulator 168 and the filter 169 are disposed adjacently on an upper shelf of the rack 190. The filter 169 is formed by inserting a filter element formed in a cartridge, not shown, in a tubular case. In this embodiment, the filter 169 is disposed on the rack 190 in a horizontal position, i.e., a position in which the length of the tubular body is extended horizontally. Since the filter element can be pulled horizontally out of the tubular case, any space of a height sufficient to enable the tubular case to be pulled upward when changing the filter element is not necessary. Thus, the filter 169 can be installed in a space of a relatively low height.

A pipe 195 connected to the inlet port 180 of the pump 166, a pipe 196 connecting the outlet port 181 of the pump 166 to the inlet port 182 of the flow stabilizing device 167, a pipe 197 connecting the outlet port 183 of the flow stabilizing device 167 to the inlet port 184 of the temperature regulator 168, a pipe 198 connecting the outlet port 185 of the temperature regulator 168 to the inlet port 186 of the filter 187, and a pipe 199 connected to the outlet port 187 of the filter 169 do not intersect each other and are extended neatly on the back side of the cleaning apparatus 112. Thus, the component parts are arranged systematically. The pipes 195 to 199 can be connected to the pump 166, the flow stabilizing device 167, the temperature regulator 168 and the filter 169 to construct the circulating circuit 163 by performing work on the side of the back surface of the cleaning apparatus 112. Consequently, the manufacture of the cleaning apparatus 112 does not need much time and labor. The neat arrangement of the pipes facilitates maintenance work. For example, work for replacing the pipes 195 to 199 with new ones after the pipes 195 to 199 have become too old for use or work for repairing the component parts can be carried out with ease by an operator only on the side of the back surface of the cleaning apparatus 112.

The liquid circulating system 135 may be constructed so as to facilitate maintenance work for maintaining the liquid circulating system 135 by an operator from a side of the cleaning apparatus 112 in the maintenance space 143. The maintenance space 143 increases the degree of freedom of maintenance work an enables efficient maintenance work.

The other cleaning apparatuses 113 to 119 are similar in construction to the cleaning apparatus 112. Wafers W are cleaned with the foregoing various cleaning liquids by the cleaning apparatuses 113 to 119.

A wafer processing method to be carried out by the cleaning system shown in FIG. 7 will be described. A carrying robot, not shown, carries a plurality of wafer carriers C each containing, for example, twenty-five uncleaned wafers W to the receiving unit 105 of the wafer receiving and handling unit 102. The wafer receiving and handling unit 102 takes out, for example, fifty wafers W from the two wafer carriers C, and the wafer carrying device 130 holds the fifty wafers W collectively. The wafers W are carried sequentially to the cleaning apparatuses 112 to 119 by the sequential operations of the wafer carrying devices 131, 132 and 133. Thus, the wafers W are cleaned to remove impurities, such as particles, adhering to the wafers W.

A cleaning process to be carried out by the cleaning apparatus 112 will be described by way of example. The cleaning liquid is supplied from the cleaning liquid tank 171 to the cleaning tank 160. Then, the carrying device 130 carries the fifty wafers W collectively into the inner tank 161. The cleaning process is started and the cleaning liquid is circulated through the circulating circuit 163. As shown in FIG. 9, the cleaning liquid overflowed the inner tank 161 into the outer tank 162 is drained into the circulating circuit 163, the cleaning liquid is cleaned, the temperature of the cleaning liquid is regulated, and then the cleaning liquid is returned into the inner tank 161. The cleaning liquid flows upward in the inner tank 161 to clean the surfaces of the wafers W uniformly. Thus, the cleaning liquid supplied into the cleaning tank 160 can repeatedly be used to reduce the consumption of the cleaning liquid.

After the cleaning process has been continued for a predetermined time, the cleaning process is terminated, and the cleaning liquid is discharged from the cleaning tank 160. Subsequently, the carrying device 130 takes out the wafers W collectively from the inner tank 161 and carries the same to the next cleaning apparatus 113. Thereafter, similar cleaning processes are carried out by the cleaning apparatuses 113 to 119. After all the cleaning processes have been completed, the wafers W are dried by the drying apparatus 121. The wafers W thus cleaned and dried are loaded into wafer carriers C and the wafer carriers C loaded with the wafers W are delivered to the next process by the loading and delivering unit 150.

The cleaning apparatus 112 is manufactured in a factory, and the maintenance of the cleaning apparatus 112 is performed after the cleaning apparatus 112 has been used for a long time. The conventional cleaning apparatus need much time and labor for manufacture and requires troublesome maintenance work because the component parts of the conventional cleaning apparatus are arranged disorderly.

In the cleaning apparatus 112 in this embodiment according to the present invention, the components including the pump 166, the flow stabilizing device 167, the temperature regulator 168 and the filter 169 are disposed with the inlet ports 180, 182, 184 and 186, and the outlet ports 181, 183, 185 and 187 facing the back surface of the cleaning apparatus 112 as shown in FIG. 10. Therefore, a satisfactory working environment can be secured and the operator facing the back surface of the cleaning apparatus is able to achieve all the necessary work for connecting the pipes to the component parts, changing the pipes, repairing and inspecting the component parts. Thus, work for the manufacture and maintenance of the cleaning apparatus can be carried out with ease.

Since the pump 166 and the flow stabilizing device 167 are disposed adjacently on the lower shelf of the rack 190, and the temperature regulator 168 and the filter 169 are disposed adjacently on the upper shelf of the rack 190, the component parts can properly be arranged in a space smaller than that required by the conventional cleaning apparatus. Consequently, the cleaning apparatus 112 can be formed in a compact construction.

Figure 16:
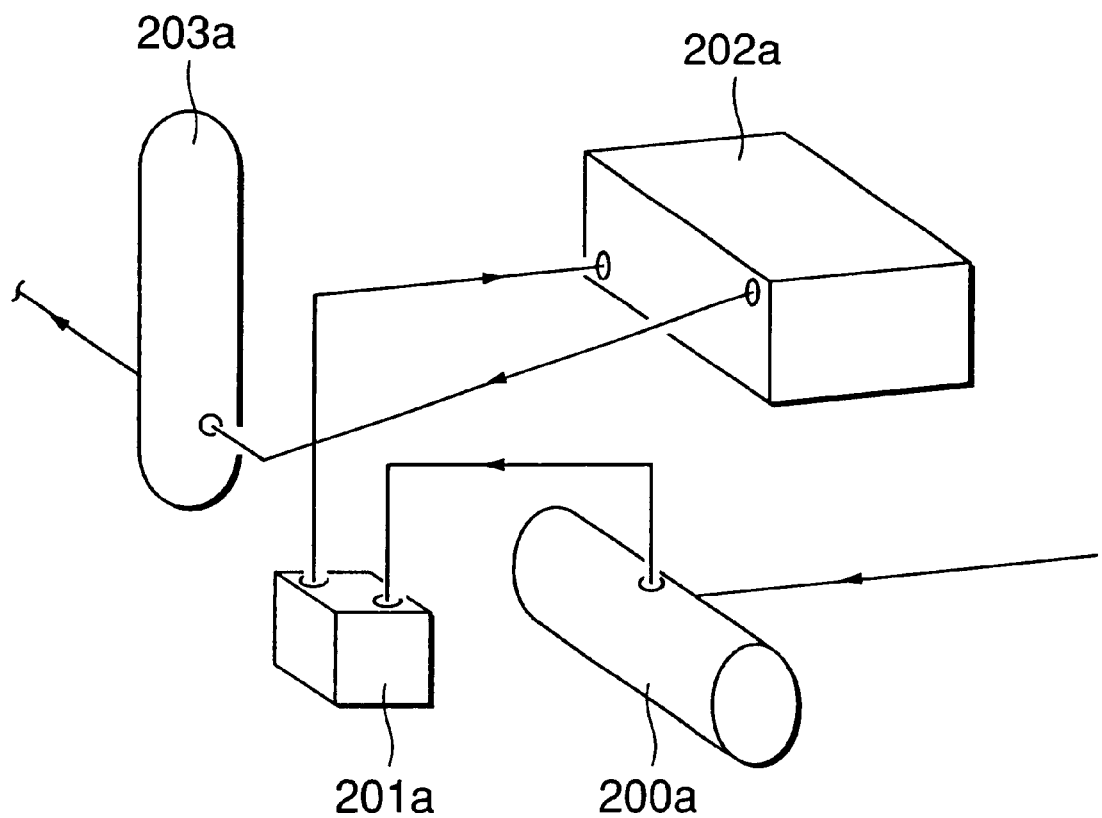
FIG. 16 is a diagrammatic perspective view of an arrangement of a pump, a flow stabilizing device, a temperature regulator and filter in a conventional cleaning apparatus.

Since the filter 169 is disposed on the rack 190 in a horizontal position, the filter 169 needs a space of a height lower than that of a space needed by the conventional filter. Whereas an arrangement of a pump 200a, a flow stabilizing device 201a, a temperature regulator 202a and a filter 203a in a conventional cleaning apparatus as shown in FIG. 16 needs a space of at least about 600 mm×about 600 mm×about 600 mm for installing the pump 200a, the flow stabilizing device 201a, the temperature regulator 202a and the filter 203a, the arrangement of the pump 166, the flow stabilizing device 167, the temperature regulator 168 and the filter in this embodiment needs a space of only about 400 mm×about 400 mm×about 500 mm.

The operator is able to easily carry out work for the manufacture and the maintenance of the cleaning apparatus 112 embodying the present invention, facing the back surface of the cleaning apparatus, and the components of the cleaning apparatus can be installed in a relatively small space. Accordingly, the cleaning apparatus 112 facilitates manufacturing work and maintenance work and can be formed in a compact construction.

Figure 13:
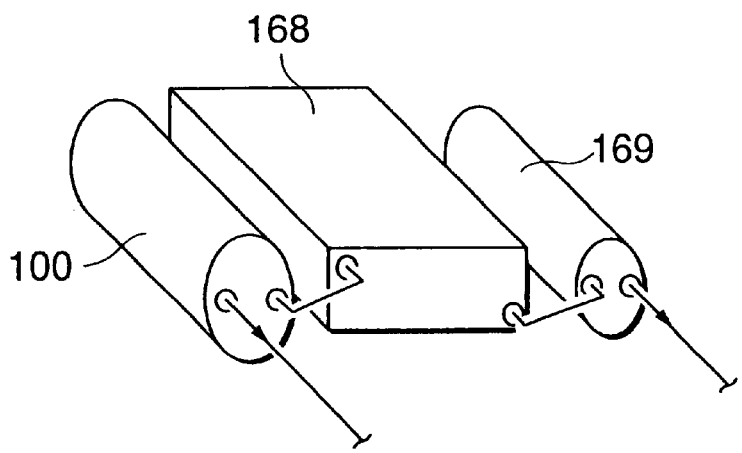
FIG. 13 is a diagrammatic perspective view of an arrangement of a pump having a flow stabilizing function, a temperature regulator and a filter.

The cleaning apparatus 112 embodying the present invention and described above has the circulating circuit 163 provided with the four component parts, i.e., the pump 166, the flow stabilizing device 167, the temperature regulator 168 and the filter 169. The circulating circuit 163 may be provided with a pump 100 having a flow stabilizing function, a temperature regulator 168 and a filter 169, and the pump 100 may be disposed on one side of the temperature regulator 167 and the filter 169 may be disposed on the other side of the temperature regulator 168 as shown in FIG. 13. The pump 100 having a flow stabilizing function stabilizes the flow of the cleaning liquid and contributes to the reduction of space necessary for installing those components. Accordingly, the cleaning apparatus 112 can be formed in a further compact construction. When the pump 100 having a flow stabilizing function is employed, at least a space of about 600 mm×about 300 mm×about 500 mm is necessary for installing those components. The cleaning apparatus is the same in construction as the cleaning apparatus 112 described above, except that the former employs the pump 100 having a flow stabilizing function, and hence component elements similar in function and construction to those described above are designated by the same reference characters and the description thereof will be omitted to avoid duplication.

Figure 14:
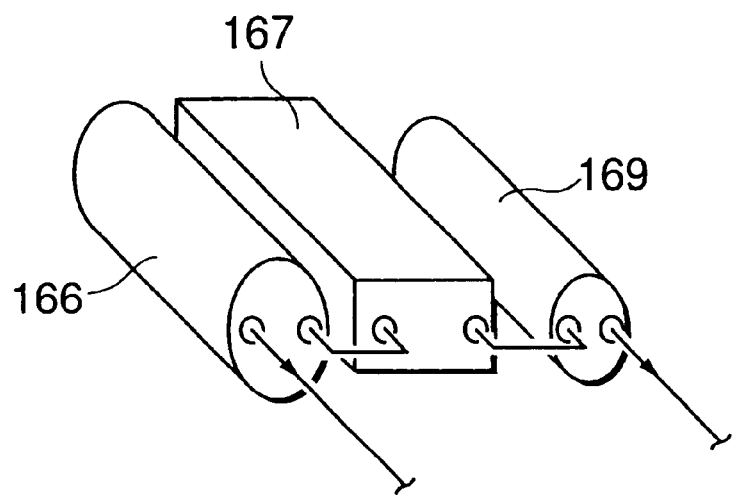
FIG. 14 is a diagrammatic perspective view of an arrangement of a pump, a flow stabilizing device and a filter.

The circulating circuit 163 may be provided with three component parts, i.e., a pump 166, a flow stabilizing device 167 and a filter 169 as shown in FIG. 14. The pump 166 is disposed on one side of the flow stabilizing device 167 and the filter 169 is disposed on the other side of the flow stabilizing device 167. Only the three component parts, similarly to those described with reference to FIG. 13, reduces space for installing the component parts of the circulating circuit 163.

Figure 15:
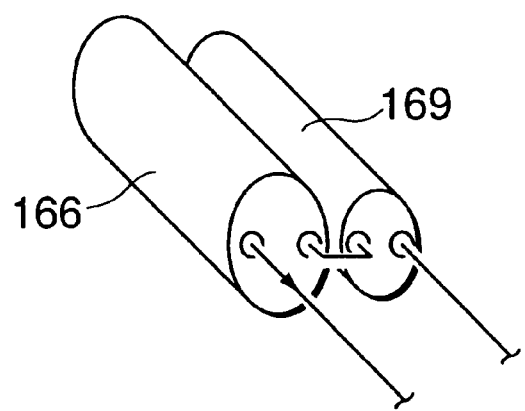
FIG. 15 is a diagrammatic perspective view of an arrangement of a pump and a filter.

The circulating circuit 163 may be provided with two component parts, i.e., a pump 166 and a filter 169 as shown in FIG. 15. The pump 166 and the filter 169 are disposed adjacently. Only the two component parts further reduces space necessary for installing the component parts. When the circulating circuit 163 having only functions to pump and filter the cleaning liquid is thus formed, the cleaning apparatus 112 can be formed in a small construction.

The present invention is not limited to the foregoing embodiments in its practical application and various modifications thereof are possible. For example, the cleaning apparatus of the present invention is applicable not only to cleaning semiconductor wafers W, but also to cleaning LCD substrates, glass substrates, CD substrates, photomasks, printed wiring boards, ceramic substrates and the like. The present invention is applicable to a cleaning apparatus of a one-pass system, which is referred to as a cleaning apparatus of a single-tank multiple chemical cleaning system, using a plurality of kinds of cleaning liquids in a single cleaning tank and a cleaning apparatus of a single-wafer processing system which cleans one wafer at a time.

According to the present invention, the components, such as the pump, the filter, the temperature regulator and the flow stabilizing device, are disposed with their inlet and outlet ports facing one plane. Therefore, an operator is able to carry out manufacturing work and maintenance work with ease facing the plane. If the plane corresponds to the side surface of the cleaning apparatus, a satisfactory working environment can be secured and work can be carried out from outside. Accordingly, the cleaning apparatus has an excellent characteristic facilitating manufacturing work and maintenance work.

The components can properly and neatly be arranged in the cleaning apparatus and space necessary for installing the component parts can be reduced. Accordingly, the cleaning apparatus can be formed in a compact construction.

The cleaning apparatus has an excellent characteristic facilitating manufacturing work and maintenance work and can be formed in a compact construction. Space necessary for installing the component parts therein can be reduced and the flow of the cleaning liquid can be stabilized when the pump having a flow stabilizing function is employed.

The filter can be installed in a space having a relatively low height. The cleaning liquid can be circulated and can repeatedly used and the consumption of the cleaning liquid can be reduced.

Third Embodiment

Figure 17:
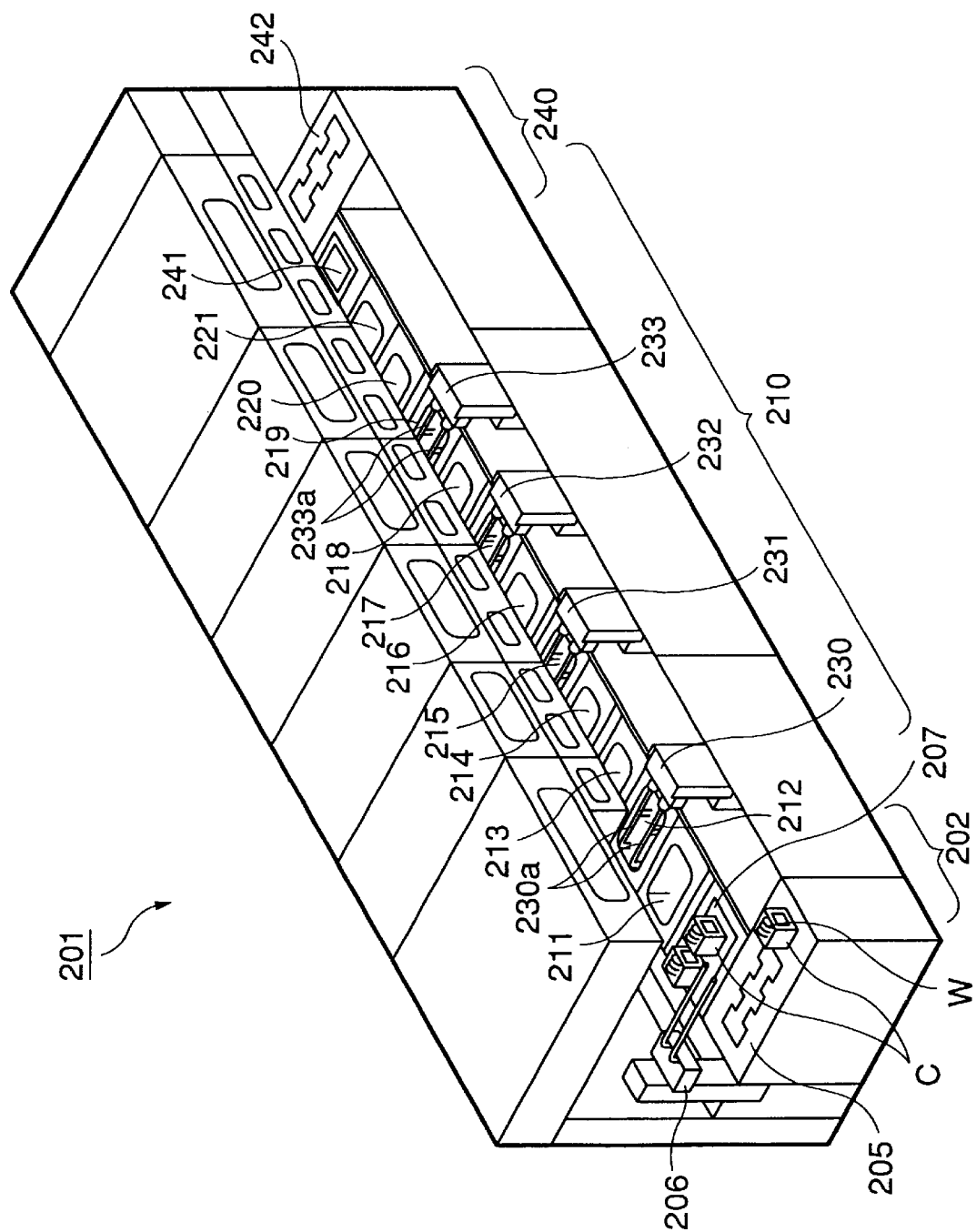
FIG. 17 is a perspective view of a cleaning system employing a cleaning apparatus in a third embodiment according to the present invention.

A cleaning apparatus in a third embodiment according to the present invention will be described hereinafter. A cleaning system employing cleaning apparatuses in accordance with the present invention carries out an integrated cleaning method including a carrier receiving process for receiving wafers contained in a wafer carrier in a lot, a wafer cleaning process, a wafer drying process and a wafer delivering process for delivering wafers contained in a wafer carrier. FIG. 17 is a perspective view of a cleaning system 201 provided with cleaning apparatuses 212 to 219 in accordance with the present invention.

The cleaning system 201 has a wafer receiving and handling unit 202 for receiving a wafer carrier C containing twenty-five uncleaned wafers W and sending the uncleaned wafers W to a cleaning unit. The wafer receiving and handling unit 202 carries two wafer carriers C received by a receiving unit 205 to a loader 207 in each carrying cycle by a carrying device 206. The loader 207 takes out wafers W from the wafer carriers C.

A cleaning and drying unit 210 for processing wafers W by a predetermined cleaning process has wafer carrying devices 230, 231, 232 and 233 arranged sequentially in that order on the front side (on this side in FIG. 7) of the cleaning and drying unit 210. A wafer chuck cleaning and drying apparatus 211 for cleaning and drying a wafer chuck 230a included in a carrying device 230, and cleaning apparatuses 212 to 219 for cleaning wafers W with various kinds of cleaning liquids. The cleaning apparatuses 212, 214, 216 and 218 clean wafers W with cleaning liquids each containing a chemical agent as a principal component, and the cleaning apparatuses 213, 215, 217 and 219 rinse wafers W with pure water to carry out a general cleaning process comprising alternate operations for chemical cleaning and rinsing. The cleaning and drying unit 210 further comprises a wafer chuck cleaning and drying apparatus 220 for cleaning and drying a wafer chuck 233a included in a carrying device 233, and a drying apparatus 221 for processing wafers W for final drying with, for example, a vapor of isopropyl alcohol (IPA). The cleaning process uses known cleaning liquids, such as an SPM cleaning liquid prepared by mixing a sulfuric acid solution ($H_2SO_4$) and a hydrogen peroxide solution ($H_2O_2$), an APM cleaning liquid prepared by mixing an aqueous ammonia solution ($NH_4OH$), pure water ($H_2O$) and a hydrogen peroxide solution, and a n HPM cleaning solution prepared by mixing a hydrochloric acid solution (HCl), pure water ($H_2O$) and a hydrogen peroxide solution. These cleaning liquids are heated at predetermined temperatures when used for the cleaning process.

The arrangement and combination of the cleaning apparatuses 212 to 219 may optionally be determined taking into consideration the kinds of cleaning processes suitable for cleaning wafers W. For example, some of those cleaning apparatuses may be omitted or cleaning apparatuses using other kinds of chemical liquids for cleaning wafers w may be added to the foregoing cleaning system.

A loading and delivering unit 240 for loading twenty-five cleaned and dried wafers W into a wafer carrier C and delivering the wafer carrier C carries a wafer carrier C loaded with wafers W to a delivery unit 242 by an unloader 241.

Since the cleaning apparatuses 212 to 219 are similar in construction, only the cleaning apparatus 212 will be described with reference to FIGS. 18 and 19 by way of example.

Figure 18:
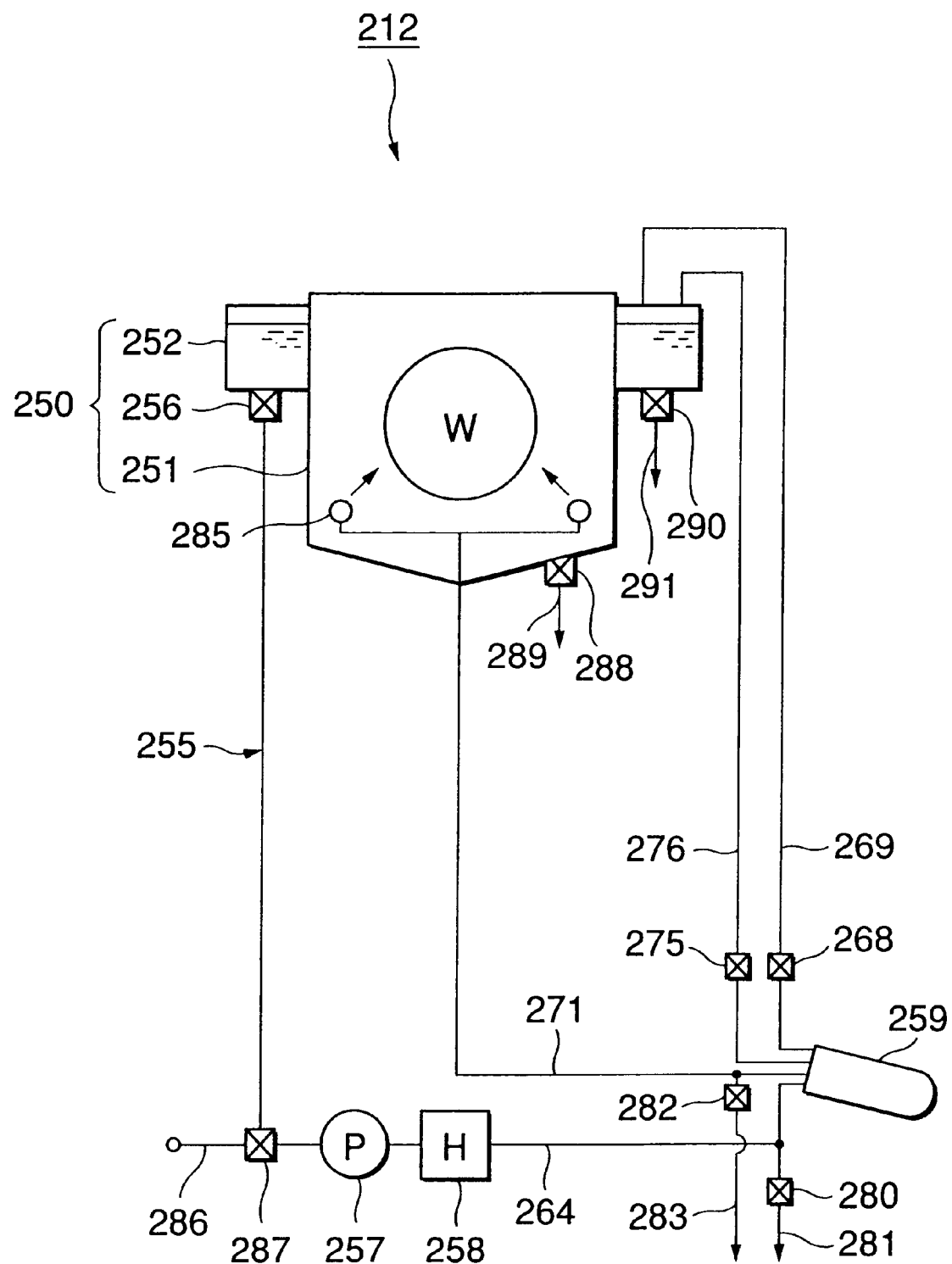
FIG. 18 is a diagrammatic view of assistance in explaining a cleaning liquid supply system included in a cleaning apparatus in accordance with the present invention.

Referring to FIG. 18 showing the liquid circulating system of the cleaning apparatus, a cleaning tank 250 included in the cleaning apparatus 212 has a box-shaped inner tank 251 of a size large enough to contain wafers W, and an outer tank 252. The inner tank 251 has an open upper end part through which wafers W are put in the inner tank 251. The outer tank 252 is formed so as to surround an open upper end part of the inner tank 251 to contain a cleaning liquid overflowed the inner tank 251.

A liquid circulating circuit 255 has one end connected to the inner tank 251 and the other end connected to the outer tank 252 to circulate the cleaning liquid during a cleaning process for cleaning wafers W. The inlet of the circulating circuit 255 is connected through a valve 256 to the bottom wall of the outer tank 252. A pump 257, a heater 258 and a filter 259 are arranged in that order in the circulating circuit 255.

Figure 19:
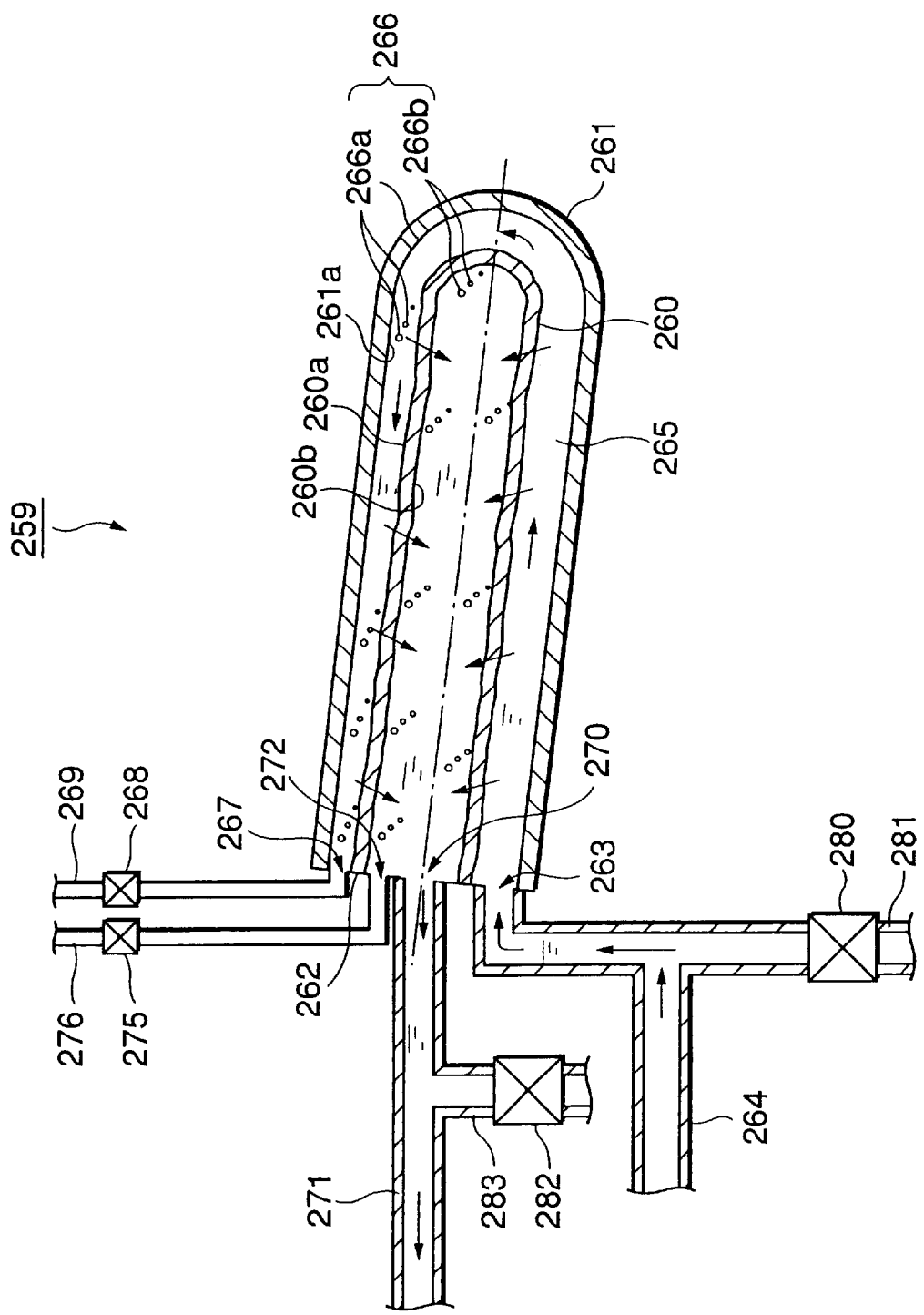
FIG. 19 is a sectional view of a filter.

As shown in FIG. 19, the filter 259 has a tubular filter element 260 made of a polytetrafluoroethylene (PTFE) resin, contained in a tubular case 261. The filter element 260 is a disposable member. The filter element #260 and the tubular case #261 of the filter 259 are laid down with their center axis inclined toward the left at an angle to the horizon and an end wall 262 of the tubular case 261 is directed to the left as viewed in FIG. 19. An inflow port 263 through which a cleaning liquid flows into the filter 259 is formed in a lower part of the end wall 262. The cleaning liquid flows through a supply line 264 connected to the heater 258, and the inflow port 263 into the filter 259.

A space defined by the outer circumference 260a of the filter element 260 and the inner circumference 261a of the tubular case 261 is a passage 265 into which the unfiltered cleaning liquid flows. Sometimes the cleaning liquid containing bubbles (gas) 266a flows into the filter 259. Since the filter 259 is inclined, the bubbles 266a move toward a higher part of the passage 265 as the cleaning liquid flows in the passage 265. A first vent hole 267 is formed in the end wall 262 at a position corresponding to the highest part of the passage 265 and on a level above the in flow port 263. Therefore, the bubbles 266 a can efficiently and preferentially be expelled from the passage 265.

A first vent line 269 provided with a valve 268 is connected to the first vent hole 267. The outlet end of the first vent line 269 opens into the outer tank 252. The unfiltered cleaning liquid discharged into the first vent line 269 is not discharged outside and is returned to the cleaning tank 250.

The cleaning liquid supplied into the passage 265 flows from the side of the outer circumference 260a (primary side) of the filter element 260 through the filter element 260 to the side of the inner circumference 260b (secondary side) of the filter element 260. The unfiltered cleaning liquid is filtered by the filter element 260 while the same flows through the filter element 260. An outflow port 270 is formed in a central part of the end wall 262. The filtered cleaning liquid flows outside from the filter 259 through the outflow port 270 into an outflow line 271 connecting the filter 259 to nozzles 285. The cleaning liquid is exposed to a reduced pressure while the same flows through the filter element 260 and gases contained therein form bubbles 266b. If the cleaning liquid contains hydrogen peroxide and is heated at a high temperature, a large number of bubbles 266b are formed. Since the filter element 260 is inclined, the bubbles 266b move upward in the inside space of the filter element 260. The filter 259 is provided with a second vent hole 272 in the end wall 262 to discharge the bubbles 266b formed in the inside space of the filter element 260. The bubbles 266b are able to escape easily from the inside space of the filter element 260. The second vent hole 272 is formed on a level above the outflow port 270 and at a position corresponding to the highest part of the filter element 260. Therefore, the bubbles 266b can efficiently and preferentially be expelled from the inside space of the filter element 260.

A second vent line 276 provided with a valve 275 is connected to the second vent hole 272. The outlet end of the second vent line 276, similarly to that of the first vent line 269, opens into the outer tank 252. The filtered cleaning liquid discharged into the second vent line 276 is not discharged out of the cleaning apparatus 212 and is returned to the cleaning tank 250. A drain line 281 provided with a valve 280 is connected to the supply line 264, and a drain line 283 provided with a valve 282 is connected to the outflow line 271 to drain the filter 259 when necessary.

The outlet of the circulating circuit 255 is connected to the nozzles 285. The valve 256 is opened to allow the cleaning liquid overflowed the inner tank 251 into the outer tank 252 to flow into the circulating circuit 255. The pump 257 pumps the cleaning liquid to force the cleaning liquid to flow sequentially through the heater 258 the filter 259. The cleaning liquid is thus adjusted to a desired temperature and is filtered. Then, the cleaning liquid is returned through the nozzle 285 into the inner tank 251. A cleaning liquid supply circuit 286 is connected to a valve 287 connected to the circulating circuit 255 to supply the cleaning liquid into the inner tank 251 at the beginning of the cleaning process and to replenish the inner tank 251 with the cleaning tank during the cleaning process. A drain line 289 provided with a drain valve 288 is connected to the bottom wall of the inner tank 251 to drain the cleaning liquid from the cleaning tank 250. A drain line 291 provided with a drain valve 290 is connected to the bottom wall of the outer tank 252. Since the inflow port 263, the first vent hole 267, the outflow port 270 and the second vent hole 272 are formed in the end wall 262 of the filter 259, the space for containing the filter element 260 is small, and maintenance work for connecting the inflow line 264, the first vent line 269, the outflow line 271 and the second vent line 276 to the end wall 262 of the filter 259 and for changing the same can be carried out with ease.

The other cleaning apparatuses 213 to 219 are similar in construction to the cleaning apparatus 212. Wafers W are cleaned with various cleaning liquids by the cleaning apparatuses 213 to 219.

A wafer processing method to be carried out by the cleaning system shown in FIG. 17 will be described. A carrying robot, not shown, carries a plurality of wafer carriers C each containing, for example, twenty-five uncleaned wafers W to the receiving unit 205 of the wafer receiving and handling unit 202. The wafer receiving and handling unit 202 takes out, for example, fifty wafers W from the two wafer carriers C, and the wafer carrying device 230 holds the fifty wafers W collectively. The wafers W are carried sequentially to the cleaning apparatuses 212 to 219 by the sequential operations of the wafer carrying devices 231, 232 and 233. Thus, the wafers Ware cleaned to remove impurities, such as particles, adhering to the wafers W.

A cleaning process to be carried out by the cleaning apparatus 212 will be described by way of example. The cleaning liquid is supplied through the cleaning liquid supply circuit 286 to the cleaning tank 250. Then, the carrying device 230 carries the fifty wafers W collectively into the inner tank 251. The cleaning process is started to clean the wafers W.

During the cleaning process, the cleaning liquid is circulated through the circulating circuit 255. As shown in FIG. 18, the cleaning liquid overflowed the inner tank 251 is collected in the outer tank 252. The valve 256 is opened and the pump 257 is started to let the cleaning liquid flow through the heater 258 and the filter 259 to adjust the temperature of the cleaning liquid and to clean the cleaning liquid. Then, the cleaning liquid is returned into the inner tank 251. The cleaning liquid flows upward in the inner tank 251 to clean the surfaces of the wafers W uniformly. Thus, the cleaning liquid supplied into the cleaning tank 250 can repeatedly be used to reduce the consumption of the cleaning liquid.

As shown in FIG. 19, the cleaning liquid supplied into the passage 265 of the filter 259 flows through the filter element 260. If the cleaning liquid supplied to the filter 259 contains the bubbles 266a or the cleaning liquid contains hydrogen peroxide (H2) 2) and is heated at a high temperature, it is possible that the large number of bubbles 266b are formed due to the pressure reducing effect of the filter element 260. The bubbles 266a and 266b must be expelled from the filter 259 to maintain the satisfactory cleaning ability of the filter 259.

Since the filter 259 is connected to the circulating circuit 255 with its center axis inclined upward to the left as viewed in FIG. 19, the bubbles 266 floating in the passage 265 and the inside space of the filter element 260 are caused to move upward in the passage 265 and the inside space of the filter element 260 by buoyancy and the current of the cleaning liquid. The bubbles 266a floating in the passage 265 are discharged from the filter 259 through the first vent hole 267, and the bubbles 266b floating in the inside of the filter element 260 is discharged from the filter 295 through the second vent hole 272. Since the first vent hole 267 is formed at a position corresponding to the highest part of the passage 265 on a level above the inflow port 263, and the second vent hole 272 is formed at a position corresponding to the highest part of the inside space of the filter element 260 on a level above the outflow port 270, the escape of the filtered cleaning liquid together with the bubbles 266 from the filter 259 can be prevented, and the bubbles 266 can efficiently and preferentially be expelled from the filter 259. Consequently, the bubbles 266 are not accumulated in the filter 259.

Even if the cleaning liquid is discharged together with the gas from the filter 259, the cleaning liquid is returned through the first drain line 269 or the second drain line 276 into the cleaning tank 250, the effluence of the cleaning liquid outside the cleaning apparatus 212 can be prevented. Since the filter 259 is connected to the circulating circuit 255 in a substantially horizontal position, the filter 259 can be installed in a space of a relatively low height.

After the cleaning process has been continued for a predetermined time, the cleaning process is terminated, and the cleaning liquid is discharged from the cleaning tank 250. Subsequently, the carrying device 230 takes out the wafers W collectively from the inner tank 251 and carries the same to the next cleaning apparatus 213. Thereafter, similar cleaning processes are carried out by the cleaning apparatuses 213 to 219. After all the cleaning processes have been completed, the wafers W are dried by the drying apparatus 221. The wafers W thus cleaned and dried are loaded into wafer carriers C and the wafer carriers C loaded with the wafers W are delivered from the cleaning system by the loading and delivering unit 240.

In this cleaning apparatus 212 embodying the present invention, the filter 259 is installed with its center axis extended in substantially horizontal position and hence the filter 259 can be installed in a space of a relatively low height. Therefore, the cleaning apparatus 212 can be formed in a compact construction. Since the first vent hole 267 is formed in the end wall 262 of the filter 259 at a position corresponding to the highest part of the passage 265 and on a level above the inflow port 263, and the second vent hole 272 is formed in the end wall 262 at a position corresponding to the highest part of the inside of the filter element 260 on a level above the outflow port 270, the bubbles 266 can efficiently and preferentially be expelled from the filter 259. Consequently, the bubbles 266 are not accumulated in the filter 259 and the satisfactory cleaning ability of the filter 259 can be maintained.

Figure 20:
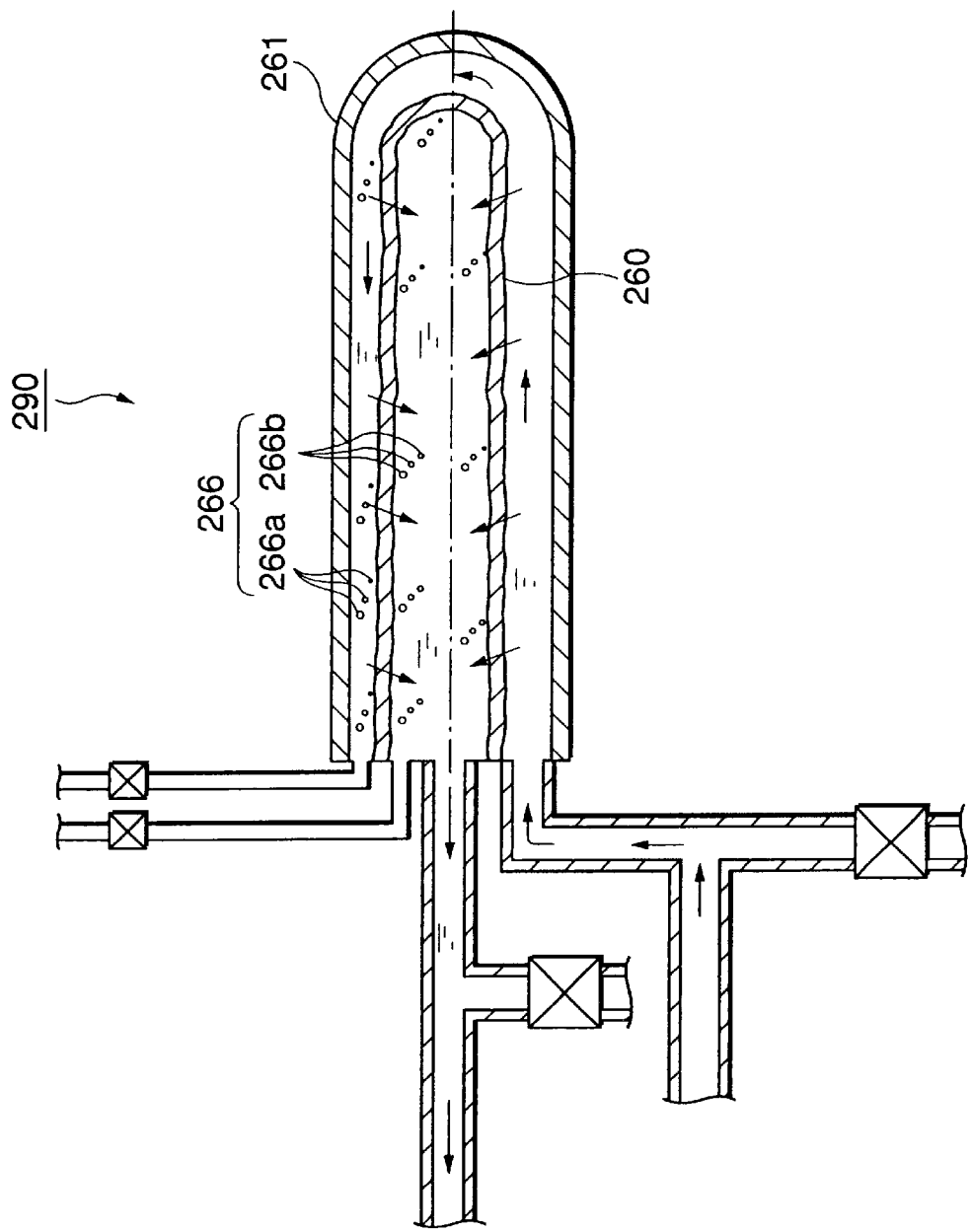
FIG. 20 is a sectional view of a filter installed in a horizontal position.

A cleaning apparatus in a modification of the cleaning apparatus 212 may be provided with a filter 290 connected to the circulating circuit 255 with the center axis of the tubular case 261 thereof extended in a horizontal position as shown in FIG. 20 instead of connecting the same to the circulating circuit 255 with the center axis of the tubular case 261 inclined upward to the left as viewed in FIG. 19. The filter 290 thus disposed, similarly to the filter 259, is able to expel bubbles 266 efficiently and preferentially. Since the filter 290 is disposed in a horizontal position, the filter 290 can be installed in a space of a relatively low height. This cleaning apparatus is the same in other respects as the cleaning apparatus 212 and hence components thereof similar in function and construction to those of the cleaning apparatus 212 are designated by the same reference characters and the description thereof will be omitted to avoid duplication.

The present invention is not limited to the foregoing embodiments in its practical application and various modifications thereof are possible. For example, the present invention is applicable to a cleaning apparatus of a one-pass system, which is referred to as a cleaning apparatus of a single-tank multiple chemical cleaning system, using a plurality of kinds of cleaning liquids in a single cleaning tank and a cleaning apparatus of a single-wafer processing system which cleans one wafer at a time. The cleaning apparatus of the present invention is applicable not only to cleaning semiconductor wafers W, but also to cleaning LCD substrates, glass substrates, CD substrates, photomasks, printed wiring boards, ceramic substrates and the like.

According to the present invention, the filter can be installed in a space of a relatively low height and hence the cleaning apparatus can be formed in a compact construction. Gases can efficiently and preferentially expelled from the filter. Accordingly, gases are not accumulated in the filter and the satisfactory cleaning ability of the filter can be maintained. Consequently, the plurality of effective cleaning apparatuses can be installed in a limited space for installation in a factory, and the productivity of, for example, a semiconductor device manufacturing line can be improved.

What is claimed is:

1. A cleaning apparatus comprising:
   a cleaning tank; and
   a cleaning liquid supply circuit for supplying a cleaning liquid to the cleaning tank, including a pump for pumping the cleaning liquid, a temperature regulator for regulating the temperature of the cleaning liquid and a filter for filtering the cleaning liquid; wherein:
   the pump has an inlet port and an outlet port formed on one side surface thereof;
   the temperature regulator has an inlet port and an outlet port formed in one side surface thereof;
   the filter has an inlet port and an outlet port formed in one surface thereof; and
   the pump, the temperature regulator and the filter are disposed so that the inlet and the outlet port of the pump, the inlet and the outlet port of the temperature regulator, and the inlet and the outlet port of the filter face substantially one plane.

2. The cleaning apparatus according to claim 1, wherein, the respective inlet and outlet ports of the pump, the temperature regulator and the filter face a side surface of the cleaning apparatus.

3. The cleaning apparatus according to claim 1 further comprising a rack storing thereon the pump, the temperature regulator and the filter.

4. The cleaning apparatus according to claim 1, wherein the pump, the temperature regulator and the filter are disposed adjacently.

5. The cleaning apparatus according to claim 1, wherein the pump has a function to stabilize the flow of the cleaning liquid.

6. A cleaning apparatus comprising:
   a cleaning tank; and
   a cleaning liquid supply circuit for supplying a cleaning liquid to the cleaning tank, including a pump for pumping the cleaning liquid and a filter for filtering the cleaning liquid; wherein:
   the pump has an inlet port and an outlet port formed on one side surface thereof;
   the filter has an inlet port and an outlet port formed in one surface thereof; and
   the pump and the filter are disposed so that the inlet and the outlet port of the pump, and the inlet and the outlet port of the filter face substantially one plane.

7. The cleaning apparatus according to claim 6, wherein the respective inlet and outlet ports of the pump and the filter face a side surface of the cleaning apparatus.

8. The cleaning apparatus according to claim 6 further comprising a rack storing the pump and the filter thereon.

9. The cleaning apparatus according to claim 6, wherein the pump and the filter are disposed adjacently.

10. The cleaning apparatus according to claim 6, wherein the pump has a function to stabilize the flow of the cleaning liquid.

11. The cleaning apparatus according to claim 6, wherein the filter is disposed so that the length of the filter extends horizontally.

12. The cleaning apparatus according to claim 6, wherein the cleaning liquid supply circuit serves as a circulation circuit for returning the cleaning liquid discharged from the cleaning tank to the cleaning tank.

\* \* \* \* \*